(12) United States Patent
Tsukikawa

(10) Patent No.: US 6,469,952 B1
(45) Date of Patent: Oct. 22, 2002

(54) SEMICONDUCTOR MEMORY DEVICE CAPABLE OF REDUCING POWER SUPPLY VOLTAGE IN A DRAM'S WORD DRIVER

(75) Inventor: Yasuhiko Tsukikawa, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 45 days.

(21) Appl. No.: 09/667,598

(22) Filed: Sep. 22, 2000

(30) Foreign Application Priority Data

Apr. 13, 2000 (JP) ........................................ 2000-112178

(51) Int. Cl.$^7$ ................................................. G11C 8/00
(52) U.S. Cl. .............................. 365/230.06; 365/230.03
(58) Field of Search ....................... 365/230.06, 230.03, 365/230.01

(56) References Cited

U.S. PATENT DOCUMENTS

| | | | |
|---|---|---|---|
| 5,539,353 A | | 7/1996 | Kajimoto et al. |
| 5,659,260 A | | 8/1997 | Kajimoto et al. |
| 5,909,141 A | * | 6/1999 | Tomishima .................. 327/526 |
| 6,038,167 A | * | 3/2000 | Miwa et al. ............ 365/185.03 |
| 6,088,286 A | * | 7/2000 | Yamauchi et al. ...... 365/236.06 |
| 6,104,665 A | * | 8/2000 | Hung et al. ............. 365/230.06 |

FOREIGN PATENT DOCUMENTS

JP  7-57465  3/1995

* cited by examiner

Primary Examiner—Hoai Ho
(74) Attorney, Agent, or Firm—McDermott, Will & Emery

(57) ABSTRACT

In a DRAM's word driver between the gate of a pulling-up p channel MOS transistor and that of a pulling-down, first n channel MOS transistor there is connected a second n channel MOS transistor having a gate receiving a power supply potential. Even when an input signal attains a high potential the first n channel MOS transistor has at its gate a potential equal to the power supply potential minus a threshold voltage of the second n channel MOS transistor. As such, the first n channel MOS transistor can receive at a gate insulating film thereof a voltage smaller than conventional. Thus the first n channel MOS transistor can operate more reliably.

12 Claims, 22 Drawing Sheets

FIG.2

| | ZMWL | SD | ZSD | QP1 | QN1 | QN2 | QN3 | WL |
|---|---|---|---|---|---|---|---|---|
| ACTIVE | VbbA | Vpp' | VbbA | Vpp'+|VbbA| | 0 | 0 | Vcc+|VbbA| | Vpp' |
| INACTIVE (1) | Vpp' | VbbA | Vcc | 0 | Vcc-Vthn+|VbbA| | Vcc+|VbbA| | Vpp'-Vcc | VbbA |
| INACTIVE (2) | Vpp' | Vpp' | VbbA | 0 | Vcc-Vthn+|VbbA| | 0 | Vpp'-Vcc | VbbA |
| INACTIVE (3) | VbbA | VbbA | Vcc | Vpp'+|VbbA| | 0 | Vcc+|VbbA| | Vcc+|VbbA| | VbbA |

FIG.4

| | ZMWL | SD | ZSD | QP1 | QN1 | QN2 | QP2 | WL |
|---|---|---|---|---|---|---|---|---|
| ACTIVE | VbbA | Vpp' | VbbA | Vpp'-|Vthp| | 0 | 0 | |VbbA| | Vpp' |
| INACTIVE (1) | Vpp' | VbbA | Vcc | 0 | Vpp'+|VbbA| | Vcc+|VbbA| | Vpp' | VbbA |
| INACTIVE (2) | Vpp' | Vpp' | VbbA | 0 | Vpp'+|VbbA| | 0 | Vpp' | VbbA |
| INACTIVE (3) | VbbA | VbbA | Vcc | Vpp'-|Vthp| | 0 | Vcc+|VbbA| | |VbbA| | VbbA |

FIG.6

| | ZMWL | SD | ZSD | QP1 | QN1 | QN2 | QN3 | QP2 | WL |
|---|---|---|---|---|---|---|---|---|---|
| ACTIVE | VbbA | Vpp' | VbbA | Vpp'-\|Vthp\| | 0 | 0 | Vcc+\|VbbA\| | \|VbbA\| | Vpp' |
| INACTIVE (1) | Vpp' | VbbA | Vcc | 0 | Vcc-Vthn+\|VbbA\| | Vcc+\|VbbA\| | Vpp'-Vcc | Vpp' | VbbA |
| INACTIVE (2) | Vpp' | Vpp' | VbbA | 0 | Vcc-Vthn+\|VbbA\| | 0 | Vpp'-Vcc | Vpp' | VbbA |
| INACTIVE (3) | VbbA | VbbA | Vcc | Vpp'-\|Vthp\| | 0 | Vcc+\|VbbA\| | Vcc+\|VbbA\| | \|VbbA\| | VbbA |

IN ACTIVE STATE

IN INACTIVE STATE

FIG.27 PRIOR ART

| | ZMWL | SD | ZSD | QP1 | QN1 | QN2 | WL |
|---|---|---|---|---|---|---|---|
| ACTIVE | VbbA | Vpp' | VbbA | Vpp'+|VbbA| | 0 | 0 | Vpp' |
| INACTIVE (1) | Vpp' | VbbA | Vcc | 0 | Vpp'+|VbbA| | Vcc+|VbbA| | VbbA |
| INACTIVE (2) | Vpp' | Vpp' | VbbA | 0 | Vpp'+|VbbA| | 0 | VbbA |
| INACTIVE (3) | VbbA | VbbA | Vcc | Vpp'+|VbbA| | 0 | Vcc+|VbbA| | VbbA |

SEMICONDUCTOR MEMORY DEVICE CAPABLE OF REDUCING POWER SUPPLY VOLTAGE IN A DRAM'S WORD DRIVER

BACKGROUND OF THE INVENTION

1. Field of the Invention

The present invention relates generally to semiconductor memory devices and particularly to semiconductor memory devices capable of reducing their power supply voltage.

2. Description of the Background Art

FIG. 17 is a block diagram showing a configuration of a conventional dynamic random access memory (referred to as a DRAM hereinafter). In the figure the DRAM includes a clock generation circuit 31, a row and column address buffer 32, a row decoder 33, a column decoder 34, a memory array 35, a sense amplifier+input/output control circuit 36, an input buffer 37, and an output buffer 38.

Clock generation circuit 31 responds to external control signals/RAS and/CAS by selecting a predetermined mode of operation for general control of the DRAM.

Row and column address buffer 32 responds to external address signals A0 to Ai (wherein i represents an integer of no less than 0) by generating row address signals RA0 to RAi and column address signals CA0 to CAi which are then input to row decoder 33 and column decoder 34, respectively.

Memory array 35 includes a plurality of memory cells each storing data of one bit. Each memory cell is arranged at a predetermined address determined by a row address and a column address.

Row decoder 33 responds to row address signals RA0 to RAi from row and column address buffer 32 by designating a row address in memory array 35. Column decoder 34 responds to column address signals CA0 to CAi from row and column address buffer 32 by designating a column address in memory array 35.

Sense amplifier+input/output control circuit 36 connects a memory cell of an address designated by row decoder 33 and column decoder 34, to one end of a data input/output line pair IOP. Data input/output line pair IOP has the other end connected to input buffer 37 and output buffer 38. Input buffer 37 in the write mode responds to an external control signal/W by transmitting externally received data Dj (wherein j represents an integer of no less than 0) to a selected memory cell via data input/output line pair IOP. Output buffer 38 in the read mode responds to an external control signal/OE by externally outputting data read from a selected memory cell.

FIG. 18 is a circuit block diagram showing a configuration of memory array 35 and sense amplifier+input/output control circuit 36 of the FIG. 17 DRAM, and FIG. 19 is a circuit diagram showing in detail a configuration of one column of memory array 35 and sense amplifier+input/output control circuit 36 shown in FIG. 17.

As shown in FIGS. 18 and 19, memory array 35 includes a plurality of memory cells MCs arranged in rows and columns, word lines WLs each provided for a row, and pairs of bit lines BL and /BL each provided for a column.

Each memory cell MC is connected to word line WL of a row corresponding thereto. Odd-numbered columns have their respective, multiple memory cells MCs connected to bit line BL and /BL alternately. Even-numbered columns have their respective, multiple memory cells MCs connected to bit line/BL and BL alternately.

Each memory cell MC includes an n channel MOS transistor 60 for access and a capacitor 61 for information storage. Each memory cell's n channel MOS transistor 60 has its gate connected to word line WL of a row corresponding thereto. N channel MOS transistor 60 is connected between bit line BL or /BL of a column corresponding thereto and one electrode of capacitor 61 of memory cell MC (a storage node SN). Each memory cell's capacitor 61 has the other electrode receiving a cell plate potential Vcp. Word line WL transmits an output from row decoder 33 and activates memory cell MC of a selected row. Bit line pair BL and /BL is used to input and output a data signal to and from a selected memory cell.

Sense amplifier+input/output control circuit 36 includes a column select gate 41, a sense amplifier 42 and an equalizer 43 provided for each column. Column select gate 41 includes n channel MOS transistors 51 and 52 connected between bit lines BL and /BL and data input/output lines IO and /IO, respectively. N channel MOS transistors 51 and 52 have their respective gates connected via a column select line CSL to column decoder 34. When column decoder 34 drives column select line CSL high or to the selected level, n channel MOS transistors 51 and 52 turn on and bit line pair BL and /BL and data input/output line pair IO and /IO are coupled together.

Sense amplifier 42 includes p channel MOS transistors 53 and 54 connected between bit lines BL and /BL and a node N42, and n channel MOS transistors 55 and 56 connected between bit lines BL and /BL and a node N42'. MOS transistors 53 and 55 have their respective gates both connected to bit line /BL, and MOS transistors 54 and 56 have their respective gates both connected to bit line BL. Nodes N42 and 42' receive sense amplifier activation signals SAP and SAN, respectively, output from clock generation circuit 31. When sense amplifier activation signals SAP and SAN are driven high and low, respectively, sense amplifier 42 responsively amplifies a slight potential difference ΔV between bit lines BL and /BL to a power supply voltage Vcc.

Equalizer 43 includes an n channel MOS transistor 57 connected between bit lines BL and /BL, and n channel MOS transistors 58 and 59 connected between bit lines BL and /BL and an node N43'. N channel MOS transistors 57 to 59 have their respective gates all connected to node N43. Node N43 receives a bit line equalization signal BLEQ and node N43' receives a bit line potential VBL, which is equal to Vcc/2. When bit line equalization signal BLEQ is driven high or attains the active level, equalizer 43 responsively equalizes a potential of bit lines BL and /BL to bit line potential VBL.

The DRAM shown in FIGS. 17 to 19 operates as described below: in the write mode, column decoder 34 allows column select signal CSL of a column corresponding to column address signals CA0 to CAi to be driven high or attain the active level and the column's column select gate 41 conducts.

Input buffer 37, in response to signal/W, transmits externally applied write data to bit line pair BL and /BL of the selected column via data input/output line pair IOP. The write data is provided as a potential difference between bit lines BL and /BL. Then, row decoder 33 allows word line WL of a row corresponding to row address signals RA0 to RAi to be driven high or attain the selected level, turning on MOS transistor 60 of memory cell MC of the row. A selected memory cell's capacitor 61 stores electric charge depending on a potential of bit line BL or /BL.

In the read mode, bit line equalization signal BLEQ is initially driven low, the equalizer's n channel MOS transistors 57 to 59 turn off, and equalizing bit lines BL and /BL is stopped. Then, as shown in FIGS. 20A to 20E, row decoder 33 allows word line WL of a row corresponding to row address signals RA0 to RAi to be driven high or attain the selected level (at time t1). Responsively, bit lines BL and /BL has a potential slightly varying with the amount of electric charge of capacitor 61 of memory cell MC activated.

Then, sense amplifier activation signals SAN and SAP are successively driven low and high (at times t2 and t3), respectively, to activate sense amplifier 42. When bit line BL is slightly higher in potential than bit line/BL, MOS transistors 53 and 56 are reduced and thus smaller in resistance than MOS transistors 54 and 55 to pull the potential of bit line BL high and the potential of bit line/BL low. In contrast, when bit line/BL is slightly higher in potential than bit line BL, MOS transistors 54 and 55 are reduced and thus smaller in resistance than MOS transistors 53 and 56 to pull the potential of bit line/BL high and the potential of bit line BL low.

Then, column decoder 34 allows column select line CSL of a column corresponding to column address signals CA0 to CAi to be driven high or attain the selected level and the column's select gate 41 conducts. The data on bit line pair BL and /BL of the selected column is fed via column select gate 41 and data input/output line pair IO and /IO to output buffer 38. Output buffer 38 externally outputs the read data in response to signal/OE.

To enhance the integration of such a DRAM, the DRAM needs to be configured of MOS transistors, capacitors, interconnections and interlayer films reduced in size. If for example an MOS transistor is reduced in gate length L, however, the short-channel effect reduces a threshold voltage Vth, resulting in an increased current leakage, a punchthrough and the like.

It is well known that the short-channel effect can be reduced by reducing an MOS transistor's gate insulating film in thickness. If a gate insulating film receives an electric field increased in intensity, however, the film's longevity will be reduced and so would the device's longevity. This phenomenon is known as the time dependent dielectric breakdown (TDDB) phenomenon. As such, to reduce the thickness of a gate insulating film while maintaining the reliability thereof the gate insulating film needs to receive a voltage reduced in level.

However, reducing a voltage applied to a gate insulating film is associated with the following disadvantage: in FIG. 21, two memory cells MC1 and MC2 are provided in the same column. Memory cell MC1 is connected to bit line BL and a word line WL1 and has a storage node SN1 held high (or at power supply potential Vcc). Memory cell MC2 is connected to bit line/BL and a word line WL2 and has a storage node SN2 held high (or at power supply potential Vcc).

In the read mode of operation, as shown in FIGS. 22A-22E, for example word line WL1 is driven high or to the selected level (at time t1), and sense amplifier 42 is activated and bit line BL is driven high and bit line /BL is driven low (at time t2). Then, word line WL1 is driven low or to the non-selected level (at time t3) and sense amplifier 42 is inactivated and equalizer 43 is also activated (at time t4) to complete a data read.

Herein, from time t2 through time t3 the word line WL1 potential Vpp is required to allow memory cell MC1 to have n channel MOS transistor 60 turned on to allow the bit line BL potential Vcc to be restored in memory cell MC1 at storage node SN1. As such, if n channel MOS transistor 60 has a threshold voltage Vthn, with a margin of 0.5V, an expression Vpp>Vcc+Vthn+0.5 needs to be satisfied.

Furthermore, from time t2 through time t4, with bit line/BL held low, the memory cell MC2 n-channel MOS transistor 60 has a subthreshold leak current and the memory cell MC2 storage node SN2 thus has potential Vcc decreasing gradually. If the leak current is large the memory should be refreshed in a reduced time and a refresh standard can thus not be satisfied. As such, the n channel MOS transistor 60 threshold voltage Vthn is set for example at approximately 1.1V. Thus the above expression is provided as Vpp>Vcc+1.6.

Thus, to ensure that an MOS transistor is reduced in film thickness and enhanced in reliability, Vpp should be reduced. In a system with word line WL having 0V or Vpp, however, Vpp should not be smaller than Vcc+1.6V.

This disadvantage can be overcome by a negative-voltage word line system, as proposed below: in this system, as shown in FIG. 23 with a solid line, word line WL has a negative potential VbbA=−ΔV1 or a positive potential Vpp'=Vpp−ΔV1'. ΔV1 and ΔV1' are substantially the same voltage. Accordingly, the memory cell MC n-channel MOS transistor 60 also has threshold voltage Vthn set to be lower by ΔV1≈ΔV1'.

Thus, if a low level is restored when memory cell MC is activated, the n channel MOS transistor 60 gate insulating film only receives Vpp', as shown in FIG. 24A, and the gate insulating film can be more reliable than when it receives Vpp conventionally. Furthermore, as shown in FIG. 24B, when memory cell MC is inactivated the n channel MOS transistor 60 gate receives a negative voltage VbbA. Thus the n channel MOS transistor 60 subthreshold leak current decreases and the memory's refresh time is increased.

The negative-voltage word line system will now be described in detail. FIG. 25 is a block diagram showing a conventional row decoder unit circuit 70 and a conventional word driver 71.

Row decoder unit circuit 70 and word driver 71, provided in row decoder 33, are provided for each word line WL. Row decoder unit circuit 70 is responsive to row address signals RA0 to RAi for producing signals ZMWL, SD, ZSD and applying the signals to word driver 71.

Signal ZMWL goes high (Vpp') or low (VbbA) in response to row address signals RA0 to RAi. Signal ZSD goes high (Vcc) or low (VbbA) in response to row address signals RA0 to RAi. Signal SD, a signal complementary to signal ZSD, goes high (Vpp') or low (VbbA). Signals ZMWL and ZSD provide four combinations of 00 (both low in level), 11 (both high in level), 10 (the former high in level and the latter low in level), and 01 (the former low in level and the latter high in level). Signals ZMWL and ZSD attain 00 only when row address signals RA0 to RAi previously assigned to word line WL corresponding thereto are input.

Word driver 71, as shown in FIG. 26, includes a p channel MOS transistor QP1 and n channel MOS transistors QN1 and QN2. P channel MOS transistor QP1 has its source receiving signal SD and its gate receiving signal ZMWL and its drain connected to word line WL associated therewith. N channel MOS transistor QN1 has its source receiving negative potential VbbA and its gate receiving signal ZMWL and its drain connected to word line WL associated therewith. N channel MOS transistor QN2 is connected to n channel MOS transistor QN1 in parallel and has its gate receiving signal ZSD. The p channel MOS transistor QP1 bulk receives Vpp' and the n channel MOS transistors QN1 and QN2 bulk receive VbbA.

FIG. 27 represents the word driver 71 operation and a voltage applied to a gate insulating film of each of MOS transistors QP1 and QN1 and QN2.

For signals ZMWL and ZSD of 00, an active state is achieved: p channel MOS transistor QP1 turns on and n channel MOS transistors QN1 and QN2 turn off and word line WL attains Vpp'. In this condition, the p channel MOS transistor QP1 gate insulating film receives Vpp'+|VbbA| while n channel MOS transistor QN1 or QN2 gate insulating film does not receive voltage.

For signals ZMWL and ZSD of 11, an inactive state (1) is attained: p channel MOS transistor QP1 turns off and n channel MOS transistors QN1 and QN2 turn on and word line WL attains VbbA. In this condition, n channel MOS transistors QN1 and QN2 have their respective gate insulating films receiving Vpp'+|VbbA| and Vcc+|VbbA|, respectively, and the p channel MOS transistor QP1 gate insulating film does not receive voltage. Since p channel MOS transistor QP1 turns off, a difference between gate voltage Vpp' and bulk voltage Vpp' of p channel MOS transistor QP1, i.e., 0V is applied to the gate insulating film.

For signals ZMWL and ZSD of 10, an inactive state (2) is attained: MOS transistors QP1 and QN2 turn off and n channel MOS transistor QN1 turns on and word line WL attains VbbA. In this condition, the n channel MOS transistor QN1 gate insulating film receives Vpp'+|VbbA| while MOS transistor QP1 or QN2 gate insulating film does not receive voltage.

For signals ZMWL and ZSD of 01, an inactive state (3) is attained: n channel MOS transistor QN2 turns on and MOS transistors QP1 and QN2 turn off and word line WL attains VbbA. In this condition, MOS transistors QP1 and QN2 have their respective gate insulating films receiving Vpp'+|VbbA| and Vcc+|VbbA|, respectively, while the n channel MOS transistor QN1 gate insulating film does not receive voltage.

In the conventional, negative-voltage word line system, however, p and n channel MOS transistors QP1 and QN1 have their respective gate insulating films receiving Vpp'+|VbbA|=Vpp, with a disadvantageous result that MOS transistors QP1 and QN1 are less reliable.

There also exists another bottleneck in reducing power supply voltage Vcc of a DRAM. More specifically, as shown in FIG. 28, to provide amplification with bit lines BL and /BL having their respective potentials of Vcc/2 and Vcc/2–ΔV, respectively, and sense amplifier activation signals SAP and SAN of Vcc and 0V, respectively, the n channel MOS transistor 56 threshold voltage Vthn is required to be smaller than the transistor's gate-source voltage Vcc/2. As such to reduce power supply voltage Vcc the n channel MOS transistor's threshold voltage Vthn should also be reduced.

If the n channel MOS transistor's threshold voltage Vthn is reduced, however, more current will be consumed in the active state. More specifically, as shown in FIG. 29, when sense amplifier 42 completes its operation, bit lines BL and /BL have potentials of Vcc and 0V, respectively, and sense amplifier activation signals SAP and SAN have Vcc and 0V, respectively, and if the n channel MOS transistor's threshold voltage Vthn is reduced the n channel MOS transistor 55 subthreshold leak current IL would increase.

For example, if an n channel MOS transistor has a threshold voltage Vthn of b 0.6V, with an active DC current of 100 μA for the entire chip, a 0.1V reduction of Vthn would increase subthreshold leak current IL by ten times. As such, Vthn reduced to 0.4V would result in the active DC current increasing to 10 mA. The value of 10 mA is not tolerable value for an active DC current.

Furthermore, to reduce threshold voltage Vthn of an MOS transistor, channel dose needs to be reduced, which would result in the MOS transistor being less resistant to punch-through. To avoid this, the MOS transistor requires gate length L increased, which would prevent the MOS transistor from being reduced in size. As such, sense amplifier 42 is limited in having an MOS transistor with threshold voltage Vthn reduced.

SUMMARY OF THE INVENTION

A main object of the present invention therefore is to provide a semiconductor memory device capable of reducing a power supply voltage and also highly reliable.

The present invention in one aspect provides a row decoder including: a first transistor of a first conductivity type, having a first electrode receiving a first signal having two values corresponding to a high potential higher than a power supply potential and a negative potential, a second electrode connected to a word line corresponding thereto, and an input electrode receiving a second signal having two values corresponding to the high potential and the negative potential; a second transistor of a second conductivity type, having a first electrode receiving the negative potential and a second electrode connected to a word line corresponding thereto; a third transistor of the second conductivity type, having a first electrode receiving the second signal, a second electrode connected to the input electrode of the second transistor, and an input electrode receiving the power supply potential; and a signal generation circuit responsive to application of a row address signal previously assigned to a word line corresponding thereto, for setting the first signal and the second signal to the high potential and the negative potential, respectively, and setting the word line corresponding thereto to the selected level. Thus, when the second signal attains the high potential the second transistor receives at its input electrode a potential equal to the power supply potential minus the third transistor's threshold voltage. As such, the second transistor's gate insulating film receives a voltage smaller than when the second signal is applied conventionally, direct to the second transistor's input electrode. Thus the second transistor can have a more reliable gate insulating film.

Preferably, the row decoder also includes a fourth transistor of the second conductivity type, connected to the second transistor in parallel and having an input electrode receiving a third signal having two values corresponding to the power supply potential and the negative potential, wherein the signal generation circuit also sets the third signal to the negative potential in response to application of a row address signal previously assigned to a word line corresponding thereto. As such, the fourth transistor can maintain at the negative potential a non-selected word line with the corresponding second signal having the negative potential.

Still preferably, the semiconductor memory device is provided on a semiconductor substrate and the negative potential is also applied to the semiconductor substrate or a well thereof of the first conductivity type. As such, a word line and the semiconductor substrate or the well can have the same negative potential, which allows a simplified configuration.

Still preferably, an external terminal may also be provided for externally applying the negative potential to the row decoder. Thus the negative potential can be stabilized.

Still preferably a plurality of memory arrays are provided and each memory array is provided with a negative-potential generation circuit for applying a negative potential to a row decoder corresponding to a memory array corresponding thereto, wherein the plurality of negative-potential generation circuits have their respective output nodes isolated from one another. Thus, an interference can be reduced between the memory arrays.

The present invention in another aspect provides a row decoder including: a first transistor of a first conductivity type, having a first electrode receiving a first signal having two values corresponding to a high potential higher than a power supply potential and a negative potential, and a second electrode connected to a word line corresponding thereto; a second transistor of a second conductivity type, having a first electrode receiving the negative potential, a second electrode connected to a word line corresponding thereto, and an input electrode receiving a second signal having two values corresponding to the high potential and the negative potential; a third transistor of the first conductivity type, having a first electrode receiving the second signal, a second electrode connected to the input electrode of the first transistor, and an input electrode receiving a ground potential; and a signal generation circuit responsive to application of a row address signal previously assigned to a word line corresponding thereto, for setting the first signal and the second signal to the high potential and the negative potential, respectively, and setting the word line corresponding thereto to the selected level. As such, when the second signal attains the negative potential the first transistor receives at its input electrode a threshold voltage of the third transistor. Thus the first transistor's gate insulating film can receive a voltage smaller than when the second signal is applied conventionally, directly to the input electrode of the first transistor. Thus the first transistor can have a more reliable gate insulating film.

Preferably, the row decoder also includes a fourth transistor of the second conductivity type, having a first electrode receiving the second signal, a second electrode connected to the input electrode of the second transistor, and an input electrode receiving the power supply potential, with the second transistor's input electrode receiving the second signal via the fourth transistor. As such, when the second signal attains the high potential the second transistor can receive at its input electrode a potential equal to the power supply potential minus a threshold voltage of the fourth transistor. Thus, the second transistor's gate insulating film can receive a voltage smaller than when the second signal is applied conventionally, directly to the input electrode of the second transistor. Thus the second transistor can have a more reliable gate insulating film. Thus the first and second transistors can be more reliable.

Still preferably, the row decoder also includes a fifth transistor of the second conductivity type, connected to the second transistor in parallel and having an input electrode receiving a third signal having two values corresponding to the power supply potential and the negative potential, wherein the signal generation circuit also sets the third signal to the negative potential in response to application of a row address signal previously assigned to a word line corresponding thereto. Thus, the fifth transistor can maintain at a negative potential a non-selected word line with the corresponding second signal having a negative potential.

Still preferably, the semiconductor memory device is provided on a semiconductor substrate and the negative potential is also applied to the semiconductor substrate or a well thereof of the first conductivity type. As such, a word line and the semiconductor substrate or the well can have the same negative potential, which allows a simplified configuration.

Still preferably, an external terminal may also be provided for externally applying a negative potential to the row decoder. As such the negative potential can be stabilized.

Still preferably, a plurality of memory arrays are provided and each memory array is provided with a negative-potential generation circuit for applying a negative potential to a row decoder corresponding to a memory array corresponding thereto, wherein the plurality of negative-potential generation circuits have their respective nodes insulated from one another. Thus, an interference can be reduced between the memory array.

The present invention in still another aspect provides: a row decoder responsive to a row address signal for selecting any of a plurality of word lines, setting the word line to the selected level and activating a plurality of memory cells associated with the word line; a sense amplifier provided for each pair of bit lines, responsive to the row decoder activating a memory cell corresponding thereto and a slight potential difference being introduced between paired bit lines corresponding thereto, for setting one of the corresponding, paired bit lines to a power supply potential while setting the other of the paired bit lines initially to a first negative potential for a predetermined period of time and then to a ground potential; and a first external terminal for externally applying the first negative potential to the sense amplifier. Since the sense amplifier may set one bit line to the power supply potential and the other bit line initially to the first negative potential for a predetermined period of time and then to the ground potential, the sense amplifier may be configured of an MOS transistor having a threshold voltage set higher than when one bit line is conventionally set to the power supply potential and the other bit line to the ground potential. Thus the sense amplifier can operate with a margin enhanced. Furthermore the first negative potential can be stabilized as it may be introduced through the first external terminal.

Preferably, the semiconductor memory device is provided on a semiconductor substrate and the first negative potential is also applied to the semiconductor substrate or a well thereof of the first conductivity type. As such, the sense amplifier and the semiconductor substrate or the well can have the same negative potential, which allows a simplified configuration.

Still preferably, each word line is set by the row decoder to either one of a second negative potential different than the first negative potential and the selected level and a second external terminal is also provided for externally applying the second negative potential to the row decoder. As such, the word line's non-selected level is the second negative potential, so that a memory cell's data cannot be erased. Furthermore the second negative potential can be stabilized as it may be introduced through the second external terminal.

Still preferably, the semiconductor memory device is provided on a semiconductor substrate and the second negative potential is applied to the semiconductor substrate or a well thereof of the first conductivity type. As such, a word line and the semiconductor substrate or the well can have the same negative potential, which allows a simplified configuration.

Still preferably, each word line is set by the row decoder to either one of the first negative potential and the selected level and the row decoder receives the first negative potential through the first external terminal. As such, the word line's non-selected level is the first negative potential, so that a memory cell's data cannot be erased.

Still preferably, the semiconductor memory device is provided on a semiconductor substrate and the first negative potential is also applied to the semiconductor substrate or a well thereof of the first conductivity type. As such, a sense amplifier and a word line, and the semiconductor substrate or the well can receive the same negative potential, which allows a simplified configuration.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 represents an operation of the FIG. 1 word driver and a voltage applied to a gate insulating film of each transistor thereof.

FIG. 4 represents an operation of the FIG. 3 word driver and a voltage applied to a gate insulating film of each transistor thereof.

FIG. 6 represents an operation of the FIG. 5 word driver and a voltage applied to a gate insulating film of each transistor thereof.

FIG. 27 represents an operation of the FIG. 26 word driver and a voltage applied to a gate insulating film of each transistor thereof.

DESCRIPTION OF THE PREFERRED EMBODIMENTS

First Embodiment

Figure 1:
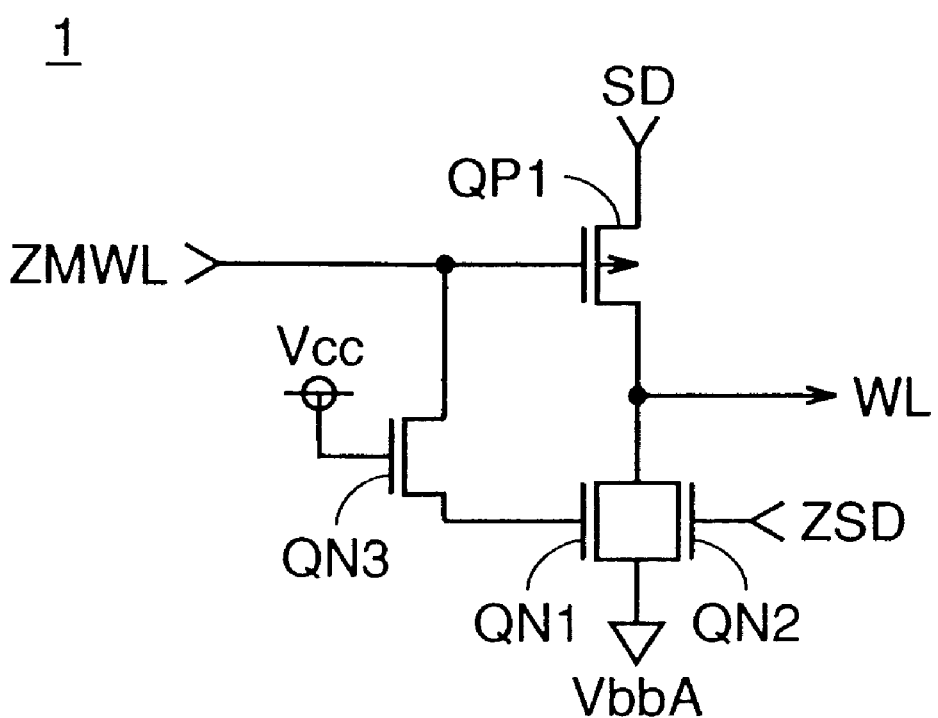
FIG. 1 is a circuit diagram showing a configuration of a word driver of a DRAM of a fist embodiment of the present invention.
Figure 26:
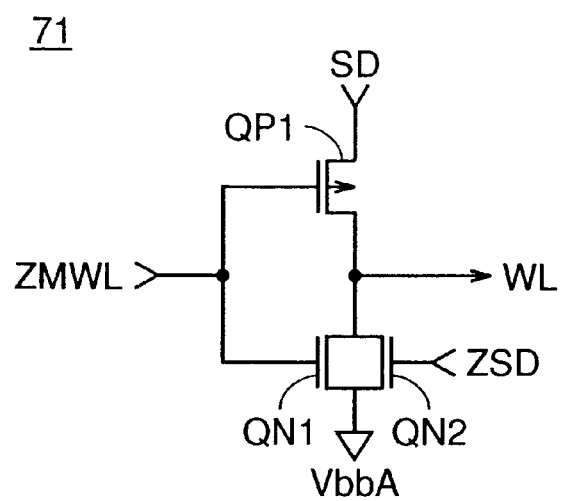
FIG. 26 is a circuit diagram showing a configuration of the word driver shown in FIG. 25.
Figure 28:
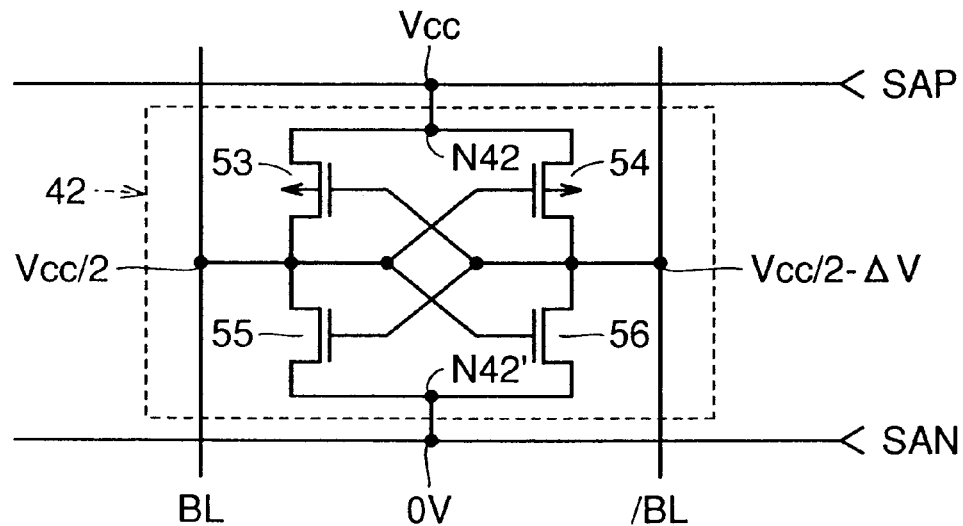
FIG. 28 is a circuit diagram for illustrating a disadvantage of a conventional sense amplifier.
Figure 29:
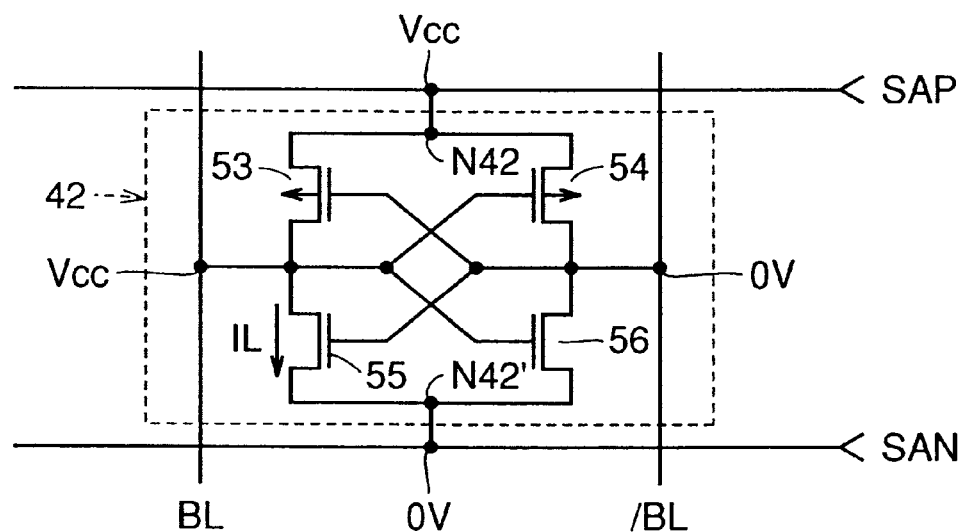
FIG. 29 is another circuit diagram for illustrating a disadvantage of a conventional sense amplifier.

FIG. 1 is a circuit diagram showing a configuration of a word driver 1 of a DRAM of a first embodiment of the present invention, as compared with FIG. 26.

As shown in FIG. 1, word driver 1 is distinguished from a word driver 71 shown in FIG. 26 in that word driver 1 further includes an n channel MOS transistor QN3 connected between the gate of a p channel MOS transistor QP1 and the gate of an n channel MOS transistor QN1 and having its gate receiving a power supply potential Vcc. A signal ZMWL is input to the gate of p channel MOS transistor QP1.

FIG. 2 represents an operation of the FIG. 1 word driver 1 and a voltage applied to a gate insulating film of each of MOS transistors QP1 and QN1 to QN3, as compared with FIG. 27.

For signals ZMWL and ZSD of 00, an active state is achieved: p channel MOS transistor QP1 and n channel MOS transistor QN3 turn on and n channel MOS transistors QN1 and QN2 turn off and word line WL attains Vpp'. In this condition, the p channel MOS transistor QP1 gate insulating film receives Vpp'+|VbbA|, the n channel MOS transistor QN1 or QN2 gate insulating film does not receive voltage, and the n channel MOS transistor QN3 gate insulating film receives Vcc+|VbbA|.

For signals ZMWL and ZSD of 11, an inactive state (1) is achieved: p channel MOS transistor QN3 turns off and n channel MOS transistor QN2 turns on. Furthermore, the n channel MOS transistor QN1 gate is charged to Vcc−Vthn via n channel MOS transistor QM3, n channel MOS transistor QN1 turns on and word line WL attains VbbA. In this condition, the n channel MOS transistors QN1 to QN3 gate insulating films receive Vcc−Vthn+|VbbA|, Vcc+|VbbA| and Vpp'−Vcc, respectively, and the p channel MOS transistor QP1 gate insulating film does not receive voltage. Since p channel MOS transistor QP1 is turned on, a difference between the transistor's gate voltage Vpp' and bulk voltage Vpp', i.e., 0V is applied to the gate insulating film.

For signals ZMWL and ZSD of 10, an inactive state (2) is achieved: MOS transistors QP1 and QN2 turn off. Furthermore, the n channel MOS transistor QN1 gate is charged to Vcc−Vthn via n channel MOS transistor QN3 and n channel MOS transistor QN1 turns on and word line WL attains VbbA. In this condition, the n channel MOS transistors QN1 and QN3 gate insulating films receive Vcc−Vthn+

|VbbA| and Vpp'−Vcc, respectively, and the MOS transistor QP1 or QN2 gate insulating film does not receive voltage.

For signals ZMWL and ZSD of 01, an inactive state (3) is achieved: MOS transistors QN2 and QN3 turn on and MOS transistors QP1 and QN1 turn off and word line WL attains VbbA. In this condition, the MOS transistors QP1, QN2 and QN3 gate insulating films receive Vpp'+|VbbA|, Vcc+|VbbA| and Vcc+|VbbA|, respectively, and the n channel MOS transistor QN1 gate insulating film does not receive voltage.

When FIG. 27 is compared with FIG. 2, in inactive state (1) and inactive state (2) the n channel MOS transistor QN1 gate insulating film receives a voltage reducing from Vpp'+|VbbA| to Vcc−Vthn+|VbbA|. Thus, in word line driver 1 n channel MOS transistor QN1 can be more reliable than in the conventional word driver 71.

It should be noted that when the memory device is actually used inactive state (1) is held for a period of time longer than the other states and n channel MOS transistor QN1 enhanced in reliability in inactive state (1) can significantly enhance the reliability of the exact word driver 1.

Second Embodiment

Figure 3:
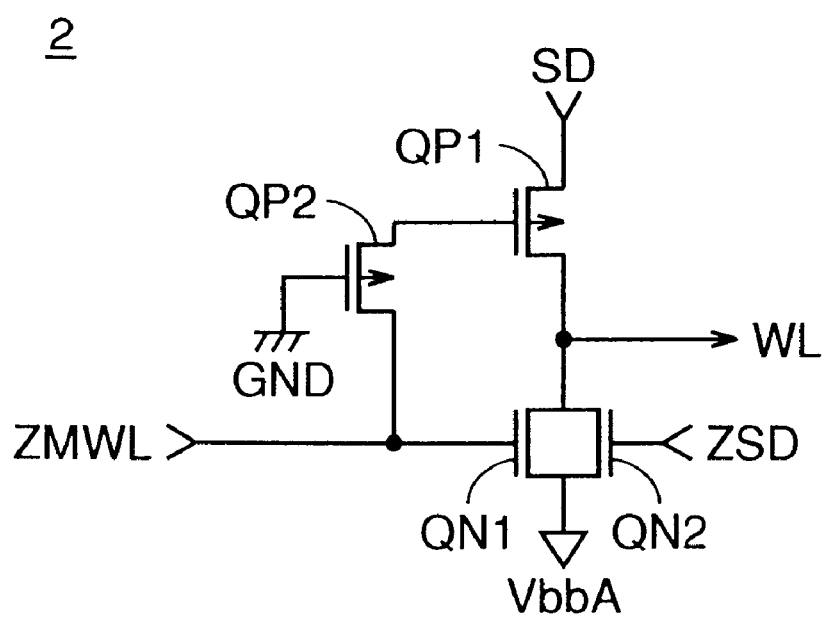
FIG. 3 is a circuit diagram showing a configuration of a word driver of a DRAM of a second embodiment of the present invention.

FIG. 3 is a circuit diagram showing a configuration of a word driver 2 of a DRAM of a second embodiment of the present invention, as compared with FIG. 26.

As shown in FIG. 3, word driver 2 is distinguished from the FIG. 26 word driver 71 in that word driver 2 also includes a p channel MOS transistor QP2 connected between the gate of p channel MOS transistor QP1 and the gate of n channel MOS transistor QN1 and having its gate grounded. Signal ZMWL is input to the gate of n channel MOS transistor QN1.

FIG. 4 represents an operation of the FIG. 3 word driver 2 and a voltage applied to a gate insulating film of each of MOS transistors QP1, QP2, QN1, QN2.

For signals ZMWL and ZSD of 00, an active state is achieved: n channel MOS transistors QN1 and QN2 turn off. Furthermore the p channel MOS transistor QP1 gate is discharged to |Vthp| via p channel MOS transistor QP2, wherein Vthp represents a threshold voltage of a p channel MOS transistor, and p channel MOS transistor QP1 turns on and word line WL attains Vpp'. In this condition, the p channel MOS transistors QP1 and QP2 gate insulating films receive Vpp'−|Vthp| and |VbbA|, respectively, and the n channel MOS transistor QN1 or QN2 gate insulating film does not receive voltage.

For signals ZMWL and ZSD of 11, an inactive state (1) is achieved: MOS transistors QP2, QN1 and QN2 turn on and p channel MOS transistor QP1 turns off and word line WL attains VbbA. In this condition, the MOS transistors QN1, QN2 and QP2 gate insulating films receive Vpp'+|VbbA|, Vcc+|VbbA| and Vpp', respectively, and the p channel MOS transistor QP1 gate insulating film does not receive voltage.

For signals ZMWL and ZSD of 10, an inactive state (2) is achieved: MOS transistors QN1 and QP2 turn on and MOS transistors QN1 and QP1 turn off and word line WL attains VbbA. In this condition, the MOS transistors QN1 and QP2 gate insulating films receive Vpp'+|VbbA| and Vpp', respectively, and the MOS transistor QP1 or QN2 gate insulating film does not receive voltage.

For signals ZMWL and ZSD of 01, an inactive state (3) is achieved: n channel MOS transistor QN1 turns off and n channel MOS transistor QN2 turns on. Furthermore the p channel MOS transistor QP1 gate is discharged to |Vthp| via p channel MOS transistor QP2, although signal SD of VbbA allows p channel MOS transistor QP1 to turn off and word line WL to attain VbbA. In this condition, the MOS transistors QP1, QN2 and QP2 gate insulating films receive Vpp'−|Vthp|, Vcc+|VbbA| and |VbbA|, respectively, and the n channel MOS transistor QN1 gate insulating film does not receive voltage.

When FIG. 27 is compared with FIG. 4, in the active state and inactive state (3) the p channel MOS transistor QP1 gate insulating film receives a voltage reducing from Vpp'+|VbbA| to Vpp'−|Vthp|. As such, in word driver 2 p channel MOS transistor QP1 can be more reliable than in the conventional word driver 71.

Third Embodiment

Figure 5:
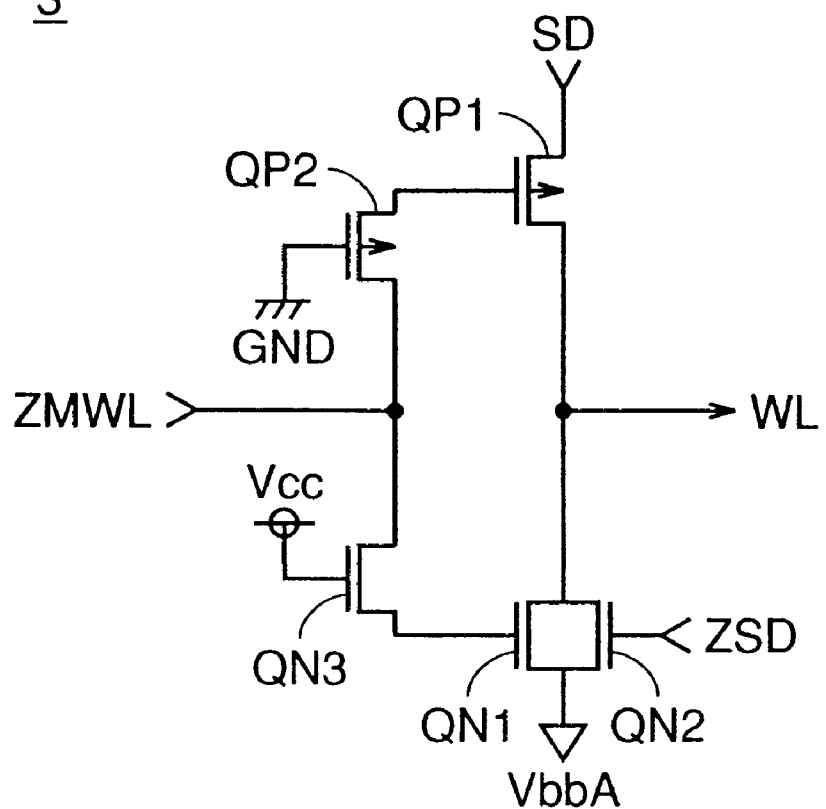
FIG. 5 is a circuit diagram showing a configuration of a word driver of a DRAM of a third embodiment of the present invention.

FIG. 5 is a circuit diagram showing a configuration of a word driver 3 of a DRAM of a third embodiment of the present invention, as compared with FIG. 26.

As shown in FIG. 5, word driver 3 is distinguished from the FIG. 26 word driver 71 in that word driver 3 also includes p and n channel MOS transistors QP2 and QN3 connected in series between the gate of p channel MOS transistor QP1 and the gate of n channel MOS transistor QN1 and having their respective gates receiving a ground potential GND and a power supply potential Vcc, respectively. Signal ZMWL is input to a node between MOS transistors QP2 and QN3.

FIG. 6 represents an operation of the FIG. 5 word driver 3 and a voltage applied to a gate insulating film of each of MOS transistors QP1, QP2 and QN1 to QN3, as compared with FIG. 27.

For signals ZMWL and ZSD of 00, an active state is achieved: n channel MOS transistor QN3 turns on and n channel MOS transistors QN1 and QN2 turn off. Furthermore the p channel MOS transistor QP1 gate is discharged to |Vthp| via p channel MOS transistor QP2 and p channel MOS transistor QP1 turns on and word line VVL attains Vpp'. In this condition, the MOS transistors QP1, QN3 and QP2 gate insulating films receive Vpp'−|Vthp|, Vcc+|VbbA| and |VbbA|, respectively, and the MOS transistor QN1 or QN2 gate insulating film does not receive voltage.

For signals ZMWL and ZSD of 11, an inactive state (1) is achieved: MOS transistors QP2 and QN2 turn on and p channel MOS transistor QP1 turns off. Furthermore the n channel MOS transistor QN1 gate is charged to Vcc−Vthn via n channel MOS transistor QN3 and n channel MOS transistor QN1 turns on and word line WL attains VbbA. In this condition, the MOS transistors QN1 to QN3 and QP2 gate insulating films receive Vcc−Vthn+|VbbA|, Vcc+|VbbA|, Vpp'−Vcc and Vpp', respectively, and the MOS transistor QP1 gate insulating film does not receive voltage.

For signals ZMWL and ZSD of 10, an inactive state (2) is achieved: p channel MOS transistor QP2 turns on and MOS transistors QP1 and QN2 turn off. Furthermore the n channel MOS transistor QN1 gate is charged to Vcc−Vthn via n channel MOS transistor QN3 and n channel MOS transistor QN1 turns on and word line WL attains VbbA. In this condition, the MOS transistors QN1, QN3 and QP2 gate insulating films receive Vcc−Vthn+|VbbA|, Vpp'−Vcc and Vpp', respectively, and the MOS transistor QP1 or QN2 gate insulating film does not receive voltage.

For signals ZMWL and ZSD of 01, an inactive state (3) is achieved: n channel MOS transistors QN2 and QN3 turn on and n channel MOS transistor QN1 turns off. Furthermore the p channel MOS transistor QP1 gate is discharged to |Vthp| via p channel MOS transistor QP2, although signal SD of VbbA allows p channel MOS transistor QP1 to turn off and word line WL to attain VbbA. In this condition, the MOS transistors QP1, QN2, QN3 and QP2 gate insulating films receive Vpp'−|Vthp|, Vcc+|VbbA|, Vcc+|VbbA| and |VbbA|, respectively, and the n channel MOS transistor QN1 gate insulating film does not receive voltage.

When FIG. 27 is compared with FIG. 6, in the active state and inactive state (3) the p channel MOS transistor QP1 gate insulating film receives a voltage reducing from Vpp'+|VbbA| to Vpp'−|Vthp|. Furthermore, in inactive states (1) and (2) the n channel MOS transistor QN1 gate insulating film receives a voltage reducing from Vpp'+|VbbA| to Vcc−Vthn+|VbbA|. As such, in word driver 3 p and n channel MOS transistors QP1 and QN1 can be more reliable than in the conventional word driver 71.

Figure 7:
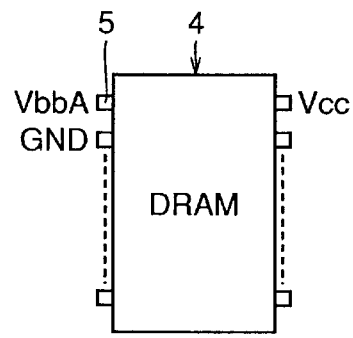
FIG. 7 shows a variation of the third embodiment.

It should be noted that in the first to third embodiments negative voltage VbbA may be generated internal to a DRAM or it may be introduced external to the DRAM. In the latter case, negative voltage VbbA may be externally introduced through an external pin provided for inputting VbbA to DRAM 4, as shown in FIG. 7. Generating negative voltage VbbA internal to a DRAM allows VbbA to be more stable than introducing VbbA external to the DRAM.

While conventionally a DRAM has a semiconductor substrate or a p well thereof receiving a negative voltage Vbb, substrate voltage Vbb may be equalized to negative voltage VbbA and negative voltage VbbA externally introduced may be used as a negative voltage applied to a word driver as well as substrate voltage Vbb.

Fourth Embodiment

Figure 8:
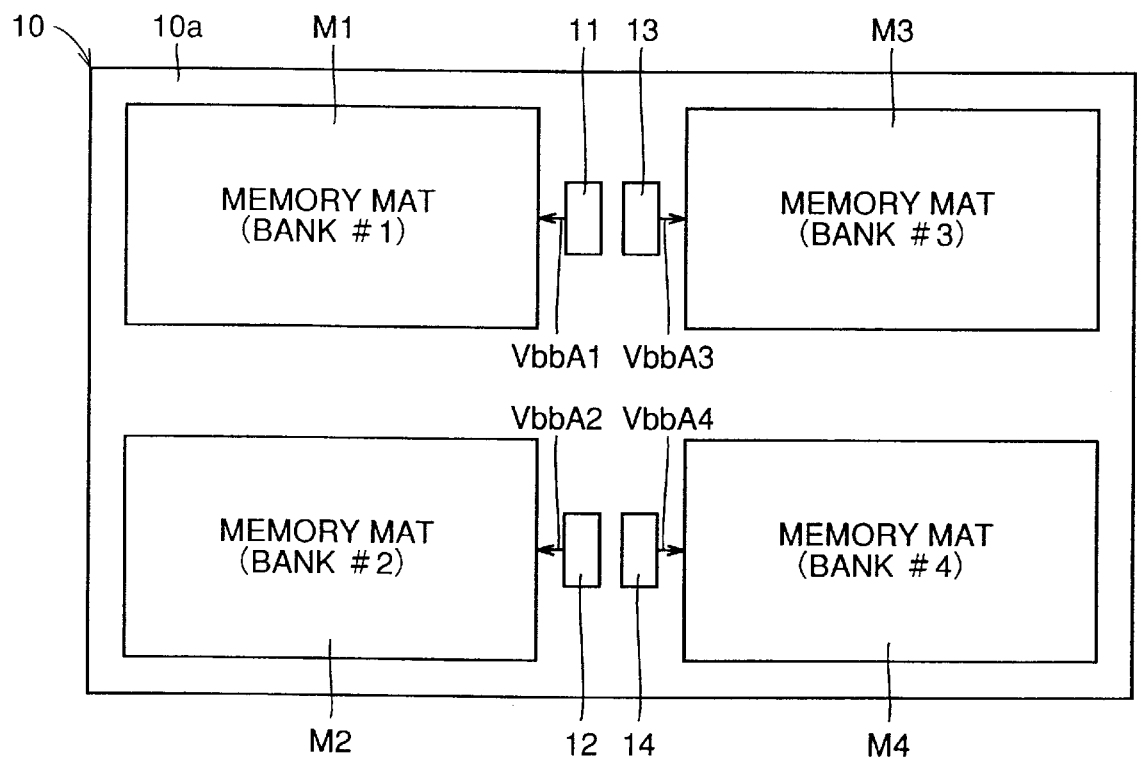
FIG. 8 shows a chip layout of an SDRAM of a fourth embodiment of the present invention.
Figure 9:
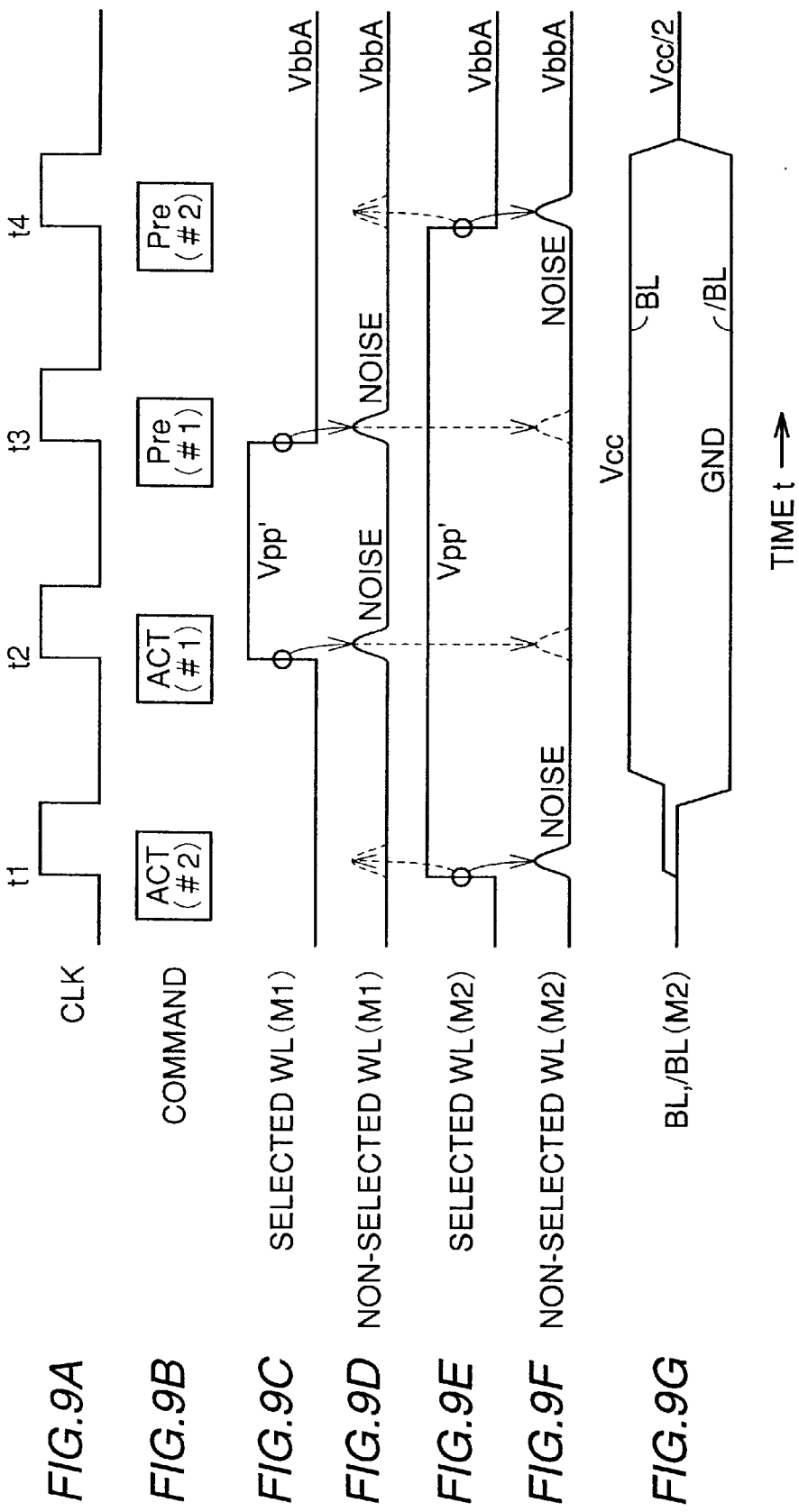
FIGS. 9A–9G are timing plots for illustrating an effect of the FIG. 8 SDRAM.

FIG. 8 shows a chip layout of a synchronous DRAM (SDRAM) 10 of a fourth embodiment of the present invention. As shown in FIG. 8, SDRAM 10 includes a rectangular semiconductor substrate 10a, four memory mats M1 to M4 (banks #1 to #4) formed at four corners, respectively, of semiconductor substrate 10a, and negative-voltage generation circuits 11 to 14 provided for four memory mats M1 to M4, respectively.

Figure 17:
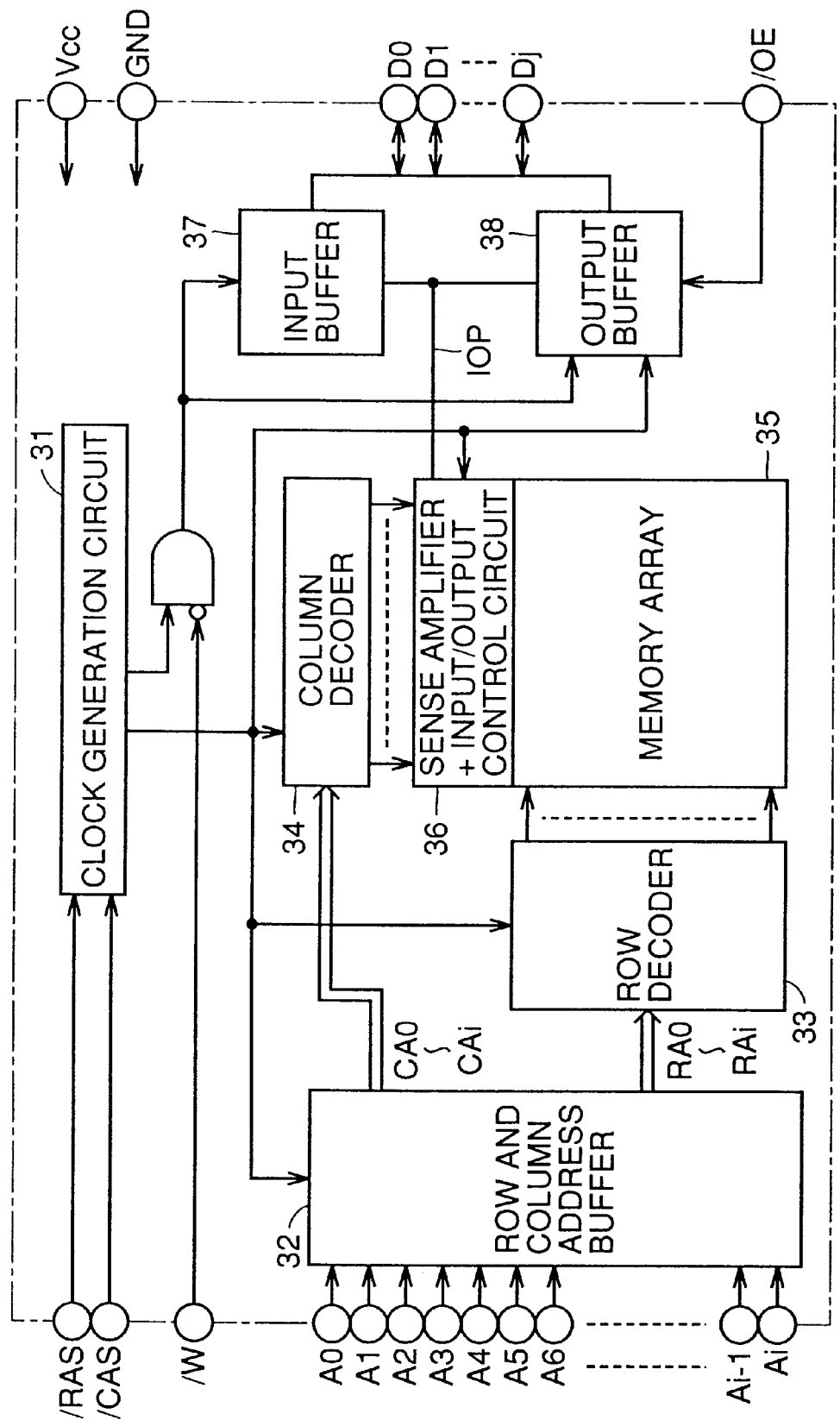
FIG. 17 is a block diagram showing a general configuration of a conventional DRAM.
Figure 18:
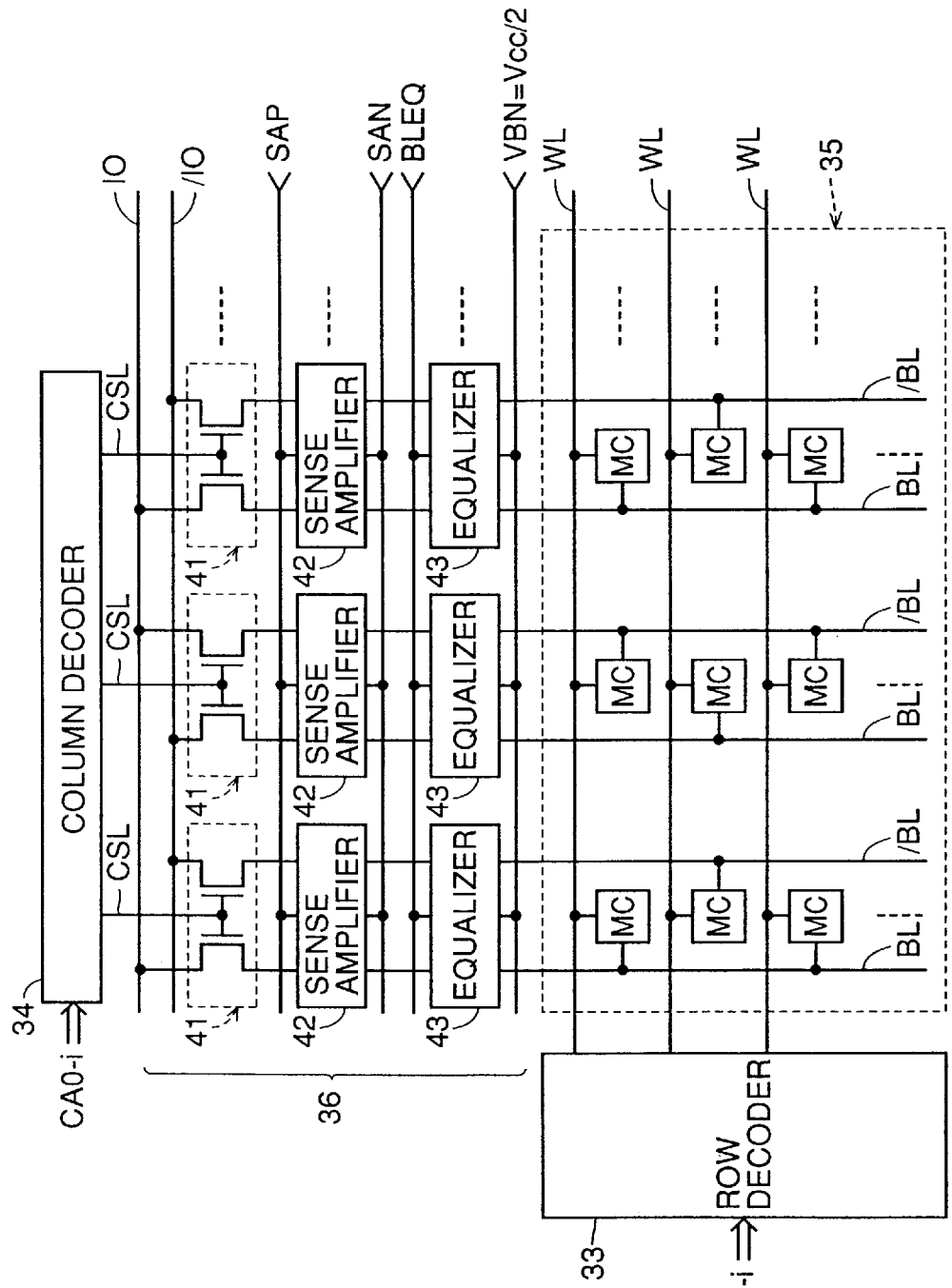
FIG. 18 is a circuit block diagram showing a configuration of the FIG. 17 memory array and sense amplifier+input/output control circuit.
Figure 19:
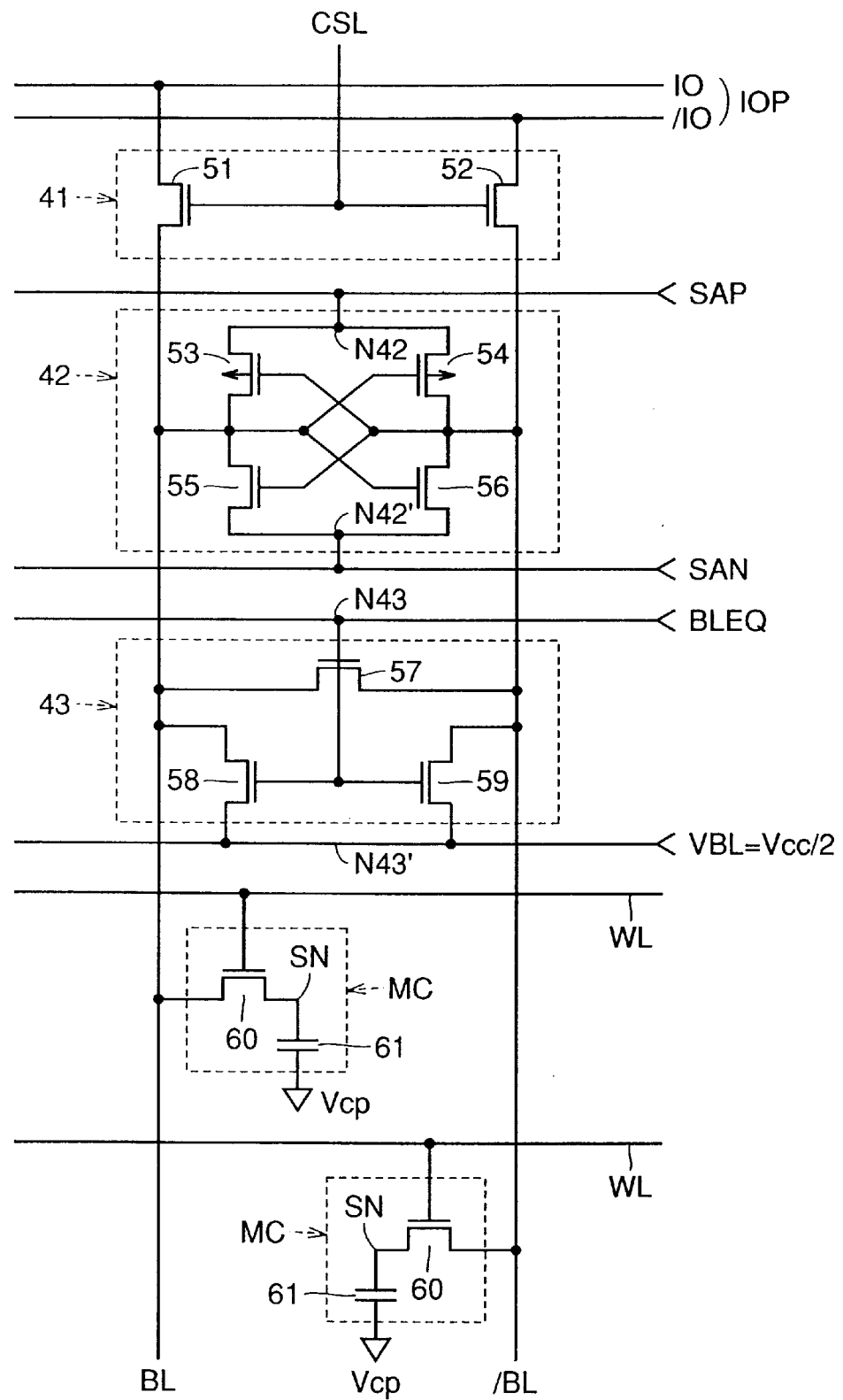
FIG. 19 is a circuit diagram more specifically showing a configuration of one column of the FIG. 18 memory array and sense amplifier+input/output control circuit.
Figure 20:
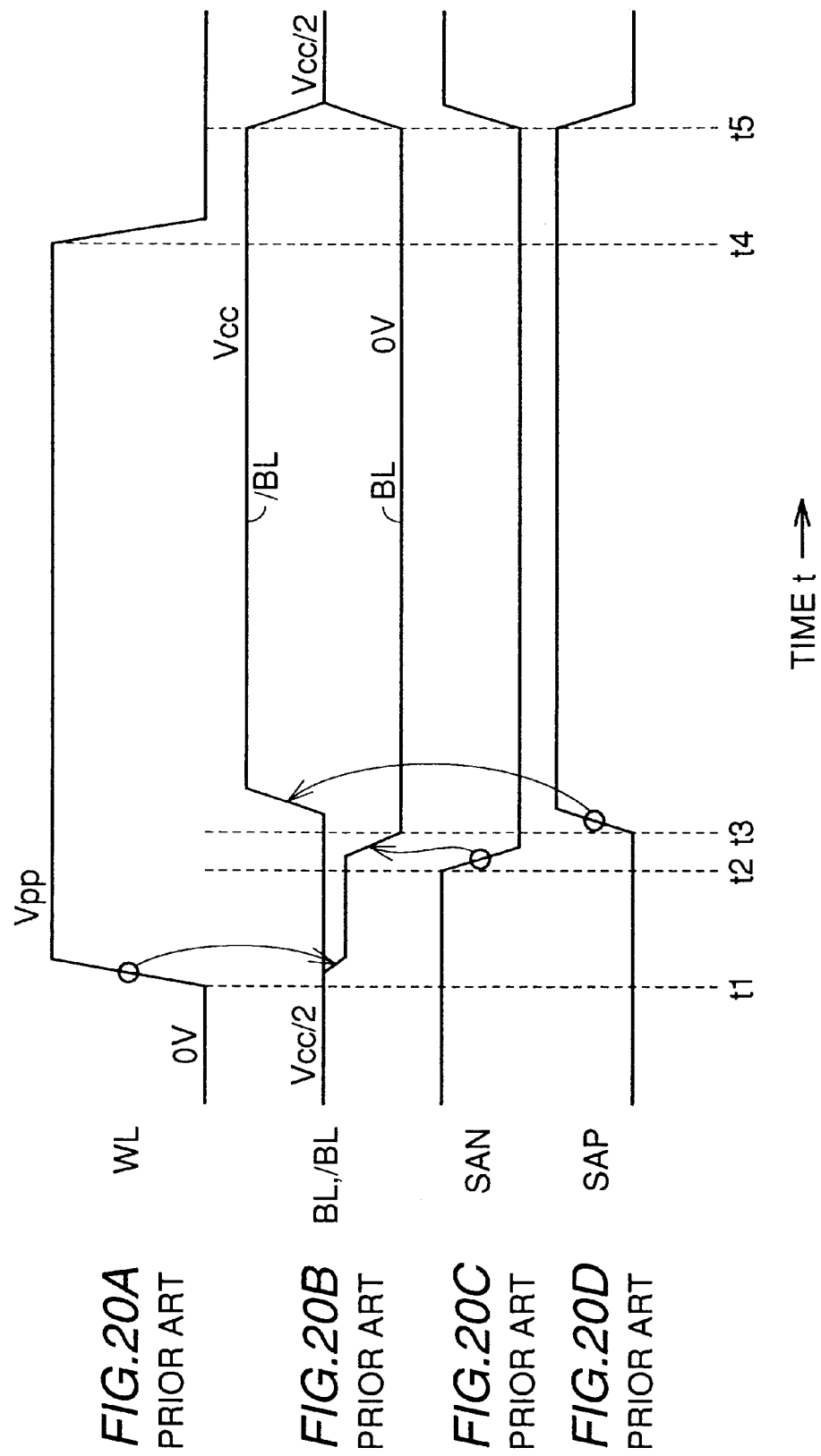
FIGS. 20A–20D are timing plots representing a read operation in the DRAM shown in FIGS. 17–19.
Figure 21:
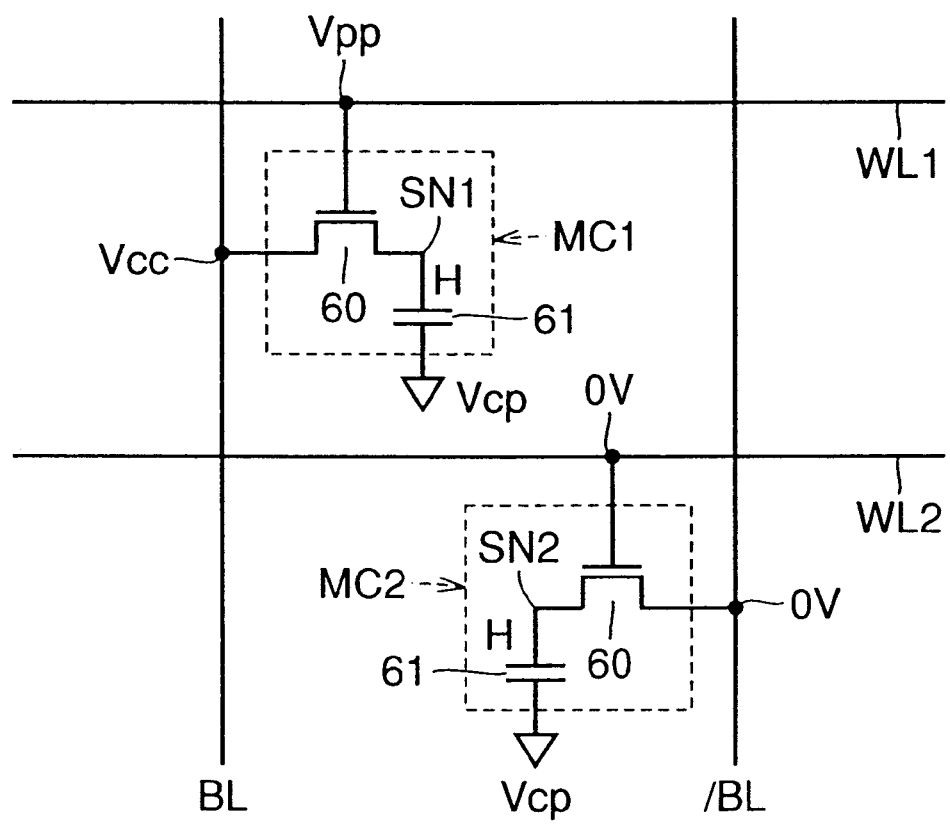
FIG. 21 is a diagram for illustrating a disadvantage of the FIG. 17 DRAM.
Figure 22:
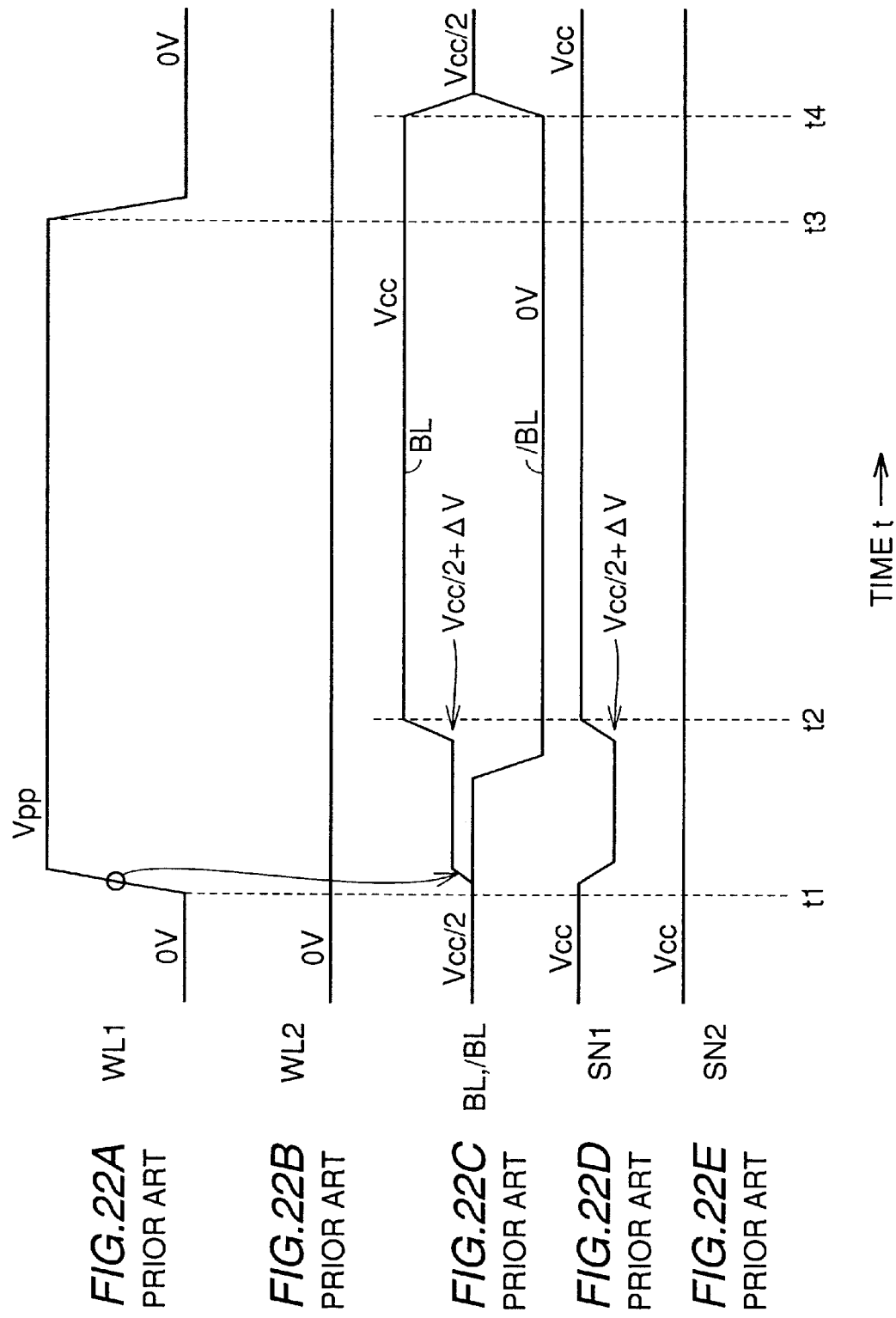
FIGS. 22A–22E are timing plots for illustrating a disadvantage of the FIG. 17 DRAM.
Figure 23:
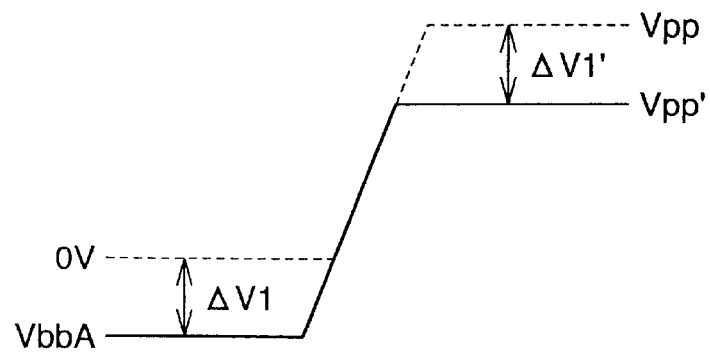
FIG. 23 is a diagram for illustrating a negative-voltage word line system.
Figure 24A:
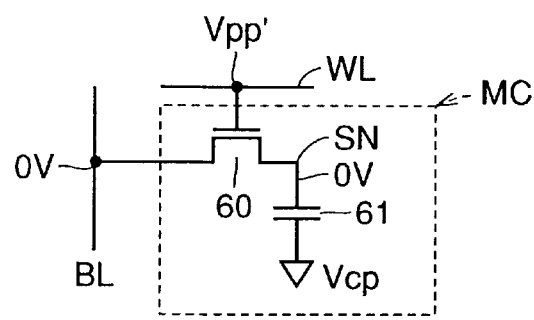
FIGS. 24A and 24B are diagrams for illustrating an effect of the negative-voltage word line system described with reference to FIG. 23.
Figure 24B:
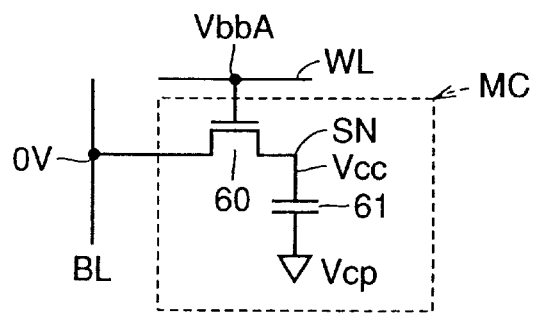
Figure 25:
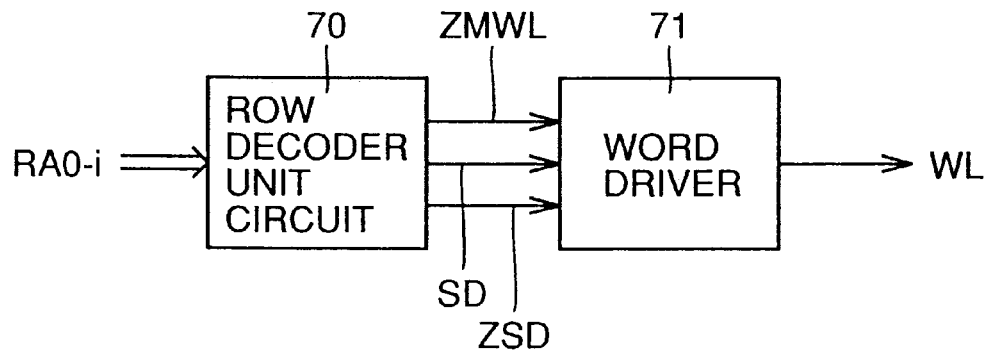
FIG. 25 is a block diagram showing a main portion of a DRAM with the FIG. 23 negative-voltage word line system applied thereto.

Memory mats M1 to M4 each includes row decoder 33, column decoder 34, memory array 35 and sense amplifier+input/output control circuit 36, as shown in FIG. 17. Memory mats M1 to M4 independently provides a row select operation. Negative-voltage generation circuits 11 to 14 generate negative voltages VbbA1 to VbbA4, respectively, and apply the negative voltages to memory mats M1 to M4, respectively. Negative voltages VbbA1 to VbbA4 are insulated from one another.

Figure 10:
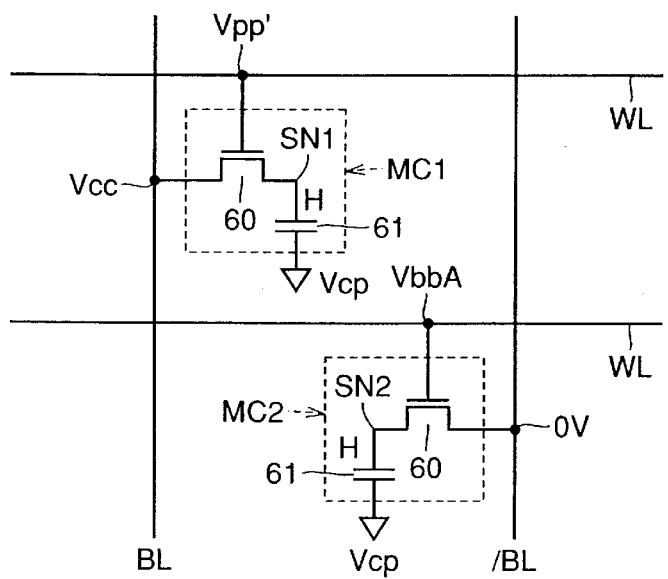
FIG. 10 is a circuit diagram for illustrating an effect of the FIG. 8 SDRAM.

SDRAM 10 operates as will now be described below: for the sake of convenience, memory mats M1 and M2 are independently subjected to a row select operation, as shown in FIGS. 9A to 9G, and, as shown in FIG. 10, in memory mat M2 is selected a word line WL connected to a memory cell MC1 with a storage node SN1 held high, while a memory cell MC2, which is connected to a word line WL in the same column as memory cell MC1 that is not selected, has storage node SN2 also held high.

At time t1, in synchronization with a clock signal CLK transitioning from low to high an active command (ACT) is applied for bank #2. Thus in memory mat M2 a selected word line WL is driven high or attains the selected level and bit line BL attains a potential of Vcc/2+ΔV. Then the memory mat M2 sense amplifier 42 is activated to allow the bit lines BL and /BL potentials to be amplified high and low, respectively.

At time t2, in synchronization with clock signal CLK transitioning from low to high an active command (ACT) is applied for bank #1. Thus in memory mat M1 a selected word line WL is driven high or attains the selected level and the memory mat M1 sense amplifier 42 is activated to amplify a potential difference between paired bit lines BL and /BL.

At time t3, in synchronization with clock signal CLK transitioning from low to high a precharge command (Pre) is applied for bank #1. Thus, in memory mat M1, the selected word line WL is driven low or attains the non-selected level, sense amplifier 42 is inactivated, and equalizer 43 precharges the pair of bit lines BL and /BL to Vcc/2 and thus equalizes them.

At time t4, in synchronization with clock signal CLK transitioning from low to high a precharge command (Pre) is applied for bank #2. Thus, in memory mat M2, the selected word line WL is driven low or attains the non-selected level, sense amplifier 42 is inactivated, and equalizer 43 precharges bit lines BL and /BL to Vcc/2 and thus equalizes them.

In SDRAM 10, memory mats M1 to M4 receive their respective negative voltages VbbA1 to VbbA4 insulated in interconnection from one another. As such, as represented in FIGS. 9A to 9G with a solid line, when in memory mat M1 (M2) word line WL selected is driven high or low, in the same memory mat M1 (M2) word line WL not selected suffers noise, while in the other memory mat M2 (M1) word line WL would not suffer noise.

Figure 11:
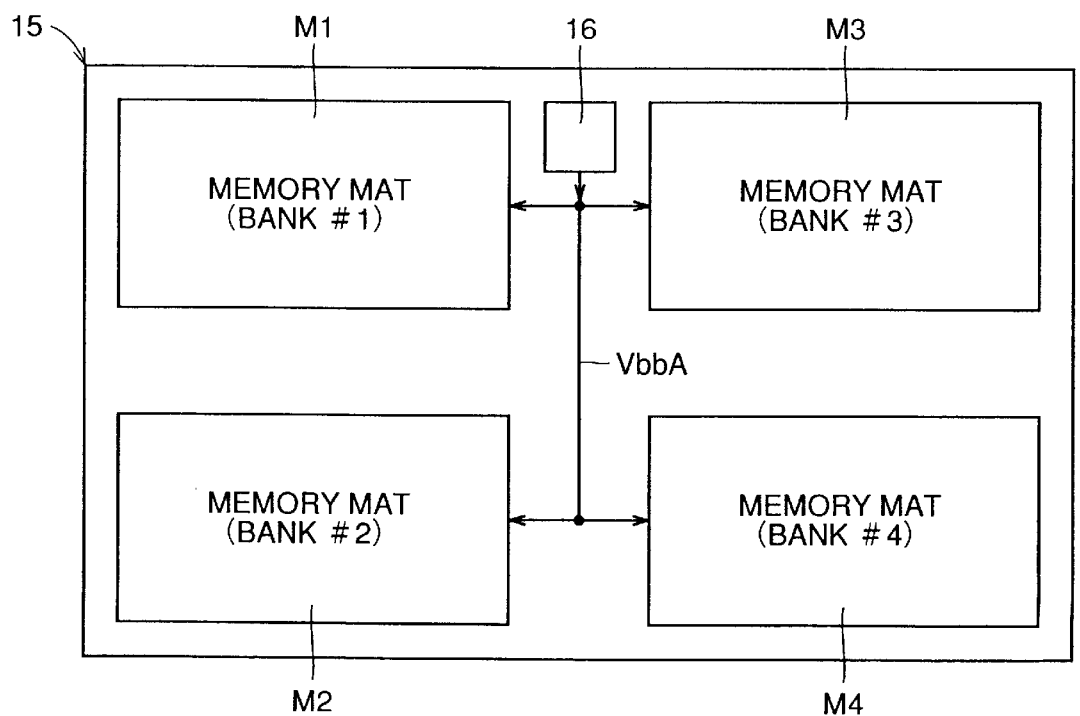
FIG. 11 is a diagram for illustrating an effect of the FIG. 8 SDRAM.

In contrast, in a conventional SDRAM 15, as shown in FIG. 11, four memory mats M1 to M4 receive negative voltage VbbA connected together in interconnection that is supplied from a single, negative-voltage generation circuit 16. As such, as shown in FIGS. 9A to 9G with dotted and solid lines, when in memory mat M1 (M2) word line WL selected is driven high or low, not only another word line WL in the same memory mat M1 (M2) but also word line WL in the other memory mat M2 (M1) would suffer noise.

As such, in FIG. 10, word line WL not selected has a potential higher than negative potential VbbA and the memory cell MC2 storage node SN2 has electric charge leaking via n channel MOS transistor 60 onto bit line/BL, resulting in storage node SN2 being reduced in level.

As such, the fourth embodiment can prevent more noise to prevent memory cell MC from losing more data thereof than conventional.

Fifth Embodiment

Figure 12:
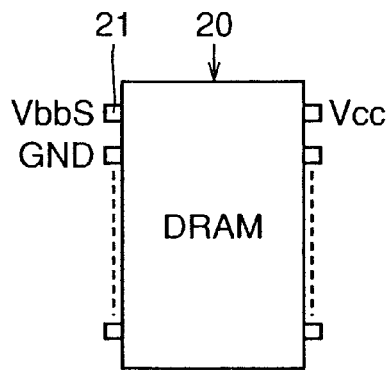
FIG. 12 shows an outer configuration of a DRAM of a fifth embodiment of the present invention.
Figure 13:
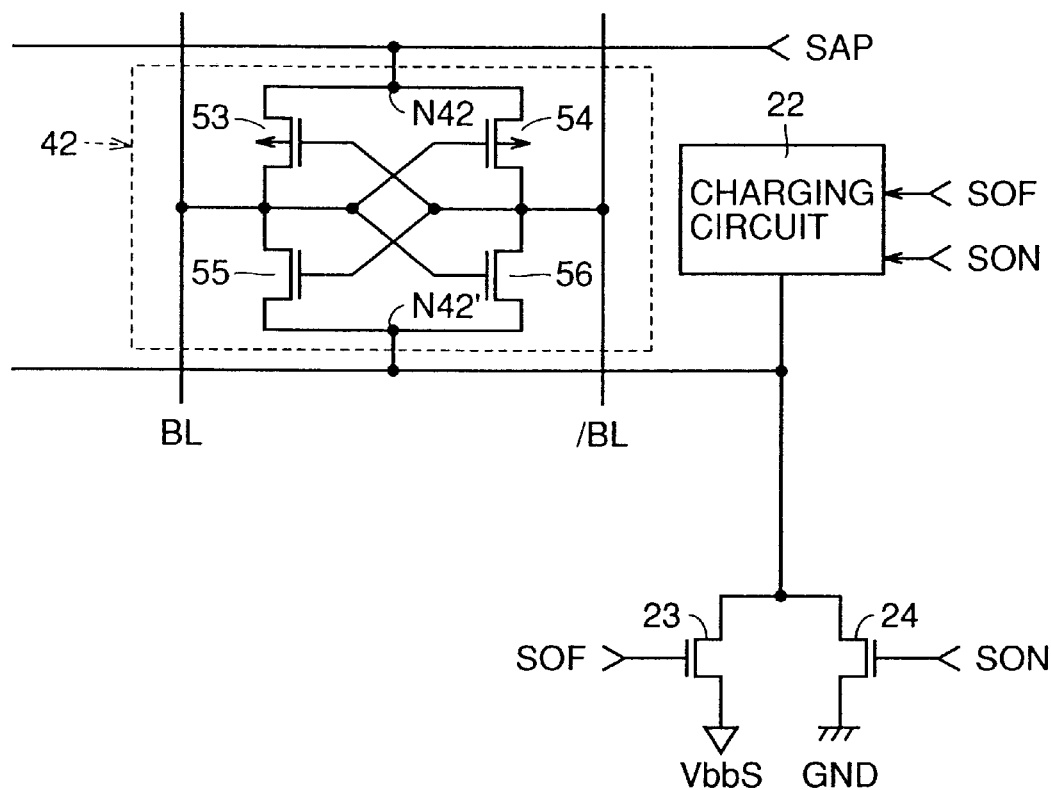
FIG. 13 is a circuit block diagram showing a main portion of the FIG. 12 DRAM.
Figure 14:
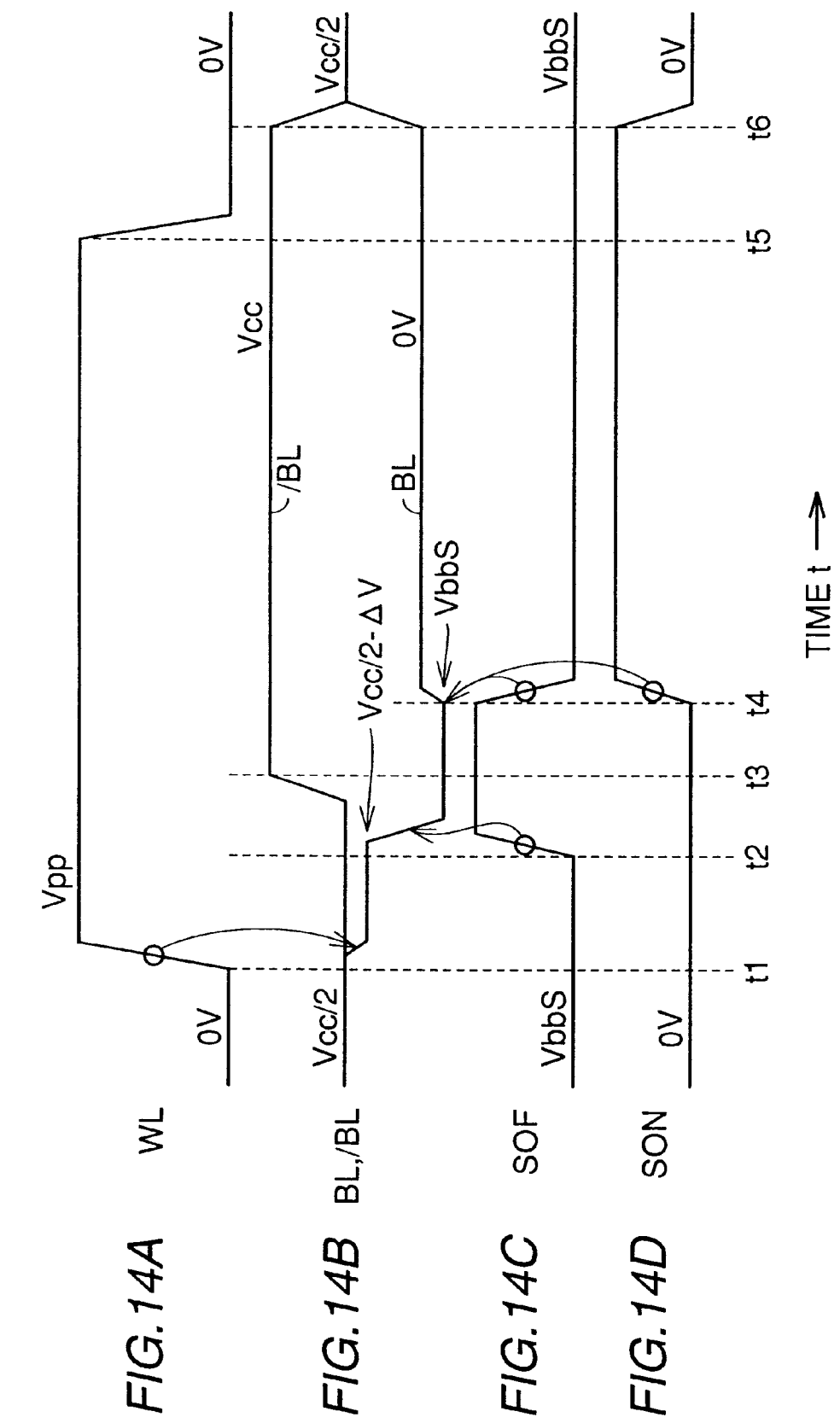
FIGS. 14A–14D are timing plots representing an operation of the DRAM shown in FIGS. 12 and 13.

FIG. 12 shows an outer configuration of a DRAM 20 of a fifth embodiment of the present invention and FIG. 13 is a circuit block diagram showing a main portion thereof.

As shown in FIGS. 12 and 13, DRAM 20 is distinguished from conventional DRAMs in that DRAM 20 is provided with an external pin 21 for receiving a negative voltage VbbS, it also includes a charging circuit 22 and n channel MOS transistors 23 and 24, and that sense amplifier activation signal SAN is replaced by sense amplifier activation signals SOF and SON.

Charging circuit 22 charges the sense amplifier 42 node N42' to Vcc/2 in response to signals SOF and SON being both driven low or inactive. N channel MOS transistor 23 is connected between the sense amplifier 42 node N42' and the negative potential VbbS line, with its gate receiving signal SOF. N channel MOS transistor 24 is connected between the sense amplifier 42 node N42' and the ground potential GND line, with its gate receiving signal SON. Signals SOF and SON are generated by the FIG. 17 clock generation circuit 31.

FIGS. 14A to 14D are timing plots representing an operation of DRAM 20 in the read mode of operation. In the initial state, signals SOF and SON are both held low or inactive, the sense amplifier 42 node N42' is charged by charging circuit 22 to Vcc/2, and sense amplifier 42 is also inactivated. At time t1, word line WL is driven high or attains the selected level. Thus it is assumed that bit line BL has a potential reduced from Vcc/2 to Vcc/2−ΔV. At time t2, signal SOF is driven high or activated, charging circuit 22 is inactivated, n channel MOS transistor 23 turns on, and the sense amplifier 42 node N42' falls to negative potential VbbS. Furthermore, signal SAP is driven high, the MOS transistors 54 and 55 resistance is reduced to be smaller than the MOS transistors 53 and 56 resistance, and bit line/BL has a potential rising to Vcc and bit line BL has a potential falling to VbbS (at time t3).

At time t4, signal SOF is driven low and signal SON is driven high, and n channel MOS transistor 23 turns off and n channel MOS transistor 24 turns on. Thus, bit line BL has a potential rising from VbbS to 0V.

At time t5, word line WL is driven low or attains the non-selected level. At time t6, signal SON is driven low and a sense operation stops and bit lines BL and /BL have their potentials equalized to Vcc/2 to complete a read operation.

In the fifth embodiment, from times t2 through t4 n channel MOS transistor 55 has a gate-source voltage of Vcc/2+|VbbS|, which is larger by |VbbS| than when the transistor conventionally has a gate-source voltage of Vcc/2. As such, the sense amplifier 42 n channel MOS transistors are only required to have threshold voltage Vthn satisfying Vcc/2+|VbbS|>Vthn, which can reduce Vcc more readily than when Vcc/2>Vthn should be satisfied as conventional.

Furthermore, introducing negative potential VbbS external to DRAM 20 allows negative potential VbbS to be more stable than generating negative potential VbbS internal to the DRAM. Thus sense amplifier 42 can operate reliably.

It is needless to say that the first to fourth embodiments may be combined with the fifth embodiment, as appropriate. In such a combination, external pins 21 and 25 may be provided, as shown in FIG. 15, for introducing negative potentials VbbS and VbbA to a DRAM 20', or negative potentials VbbS and VbbA may be equalized to the same potential Vbb which may be introduced to DRAM 20' through an external pin provided as shown in FIG. 16.

Figure 15:
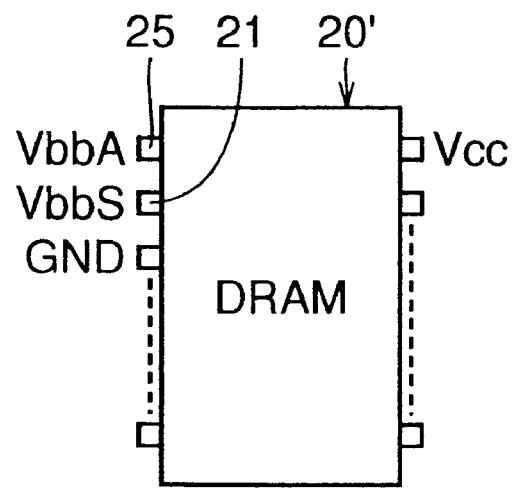
FIG. 15 shows a variation of the fifth embodiment.
Figure 16:
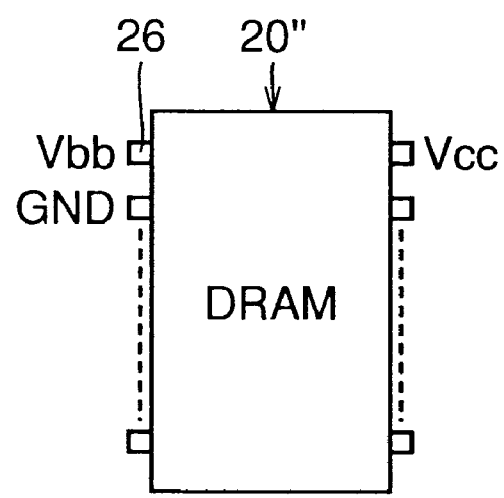
FIG. 16 shows another variation of the fifth embodiment.

While conventionally a DRAM has a semiconductor substrate or a p well thereof receiving negative potential Vbb, substrate potential Vbb and both or either one of negative potentials VbbS and VbbA may be equalized to the same potential Vbb which may be externally introduced, as shown in FIGS. 12, 15 and 16, to be used as a negative potential applied to a word driver and/or a sense amplifier as well as substrate potential Vbb.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a memory array including a plurality of memory cells arranged in a plurality of rows and a plurality of columns, a plurality of word lines provided for the plurality of rows, respectively, and a plurality of pairs of bit lines provided for the plurality of columns, respectively;
   a row decoder provided for each word line, responsive to application of a row address signal previously allotted a word line corresponding thereto, for setting the word line corresponding thereto to a selected level and activating a plurality of memory cells corresponding thereto;
   a column decoder responsive to a column address signal for selecting any pair of said plurality of pairs of bit lines; and
   a read/write circuit reading/writing data from/to a memory cell activated by said row decoder, via a pair of bit lines selected by said column decoder;
   said row decoder including
      a first transistor of a first conductivity type, having a first electrode receiving a first signal having two values corresponding to a high potential higher than a power supply potential and a negative potential, a second electrode connected to a word line corresponding thereto, and an input electrode receiving a second signal having two values corresponding to said high potential and said negative potential,
      a second transistor of a second conductivity type, having a first electrode receiving said negative potential and a second electrode connected to a word line corresponding thereto,
      a third transistor of the second conductivity type, having a first electrode receiving said second signal, a second electrode connected to the input electrode of said second transistor, and an input electrode receiving said power supply potential, and
      a signal generation circuit responsive to application of a row address signal previously allotted a word line corresponding thereto, for setting said first signal and said second signal to said high potential and said negative potential, respectively, and setting the word line corresponding thereto to a selected level.

2. The semiconductor device according to claim 1, wherein:
   said row decoder also includes a fourth transistor of the second conductivity type connected to said second transistor in parallel and having an input electrode receiving a third signal having two values corresponding to said power supply potential and said negative potential; and
   said signal generation circuit is responsive to a row address signal previously allotted a word line corresponding thereto, for setting said third signal to said negative potential.

3. The semiconductor memory device according to claim 1, provided on a semiconductor substrate, wherein said negative potential is also applied to said semiconductor substrate or a well thereof of the first conductivity type.

4. The semiconductor memory device according to claim 1, further comprising an external terminal for externally applying said negative potential to said row decoder.

5. The semiconductor memory device according to claim 1, wherein more than one said memory array are provided, each memory array being provided with a negative-potential generation circuit for applying said negative potential to said row decoder corresponding to a memory array corresponding thereto, more than one said negative-potential generation circuit having their respective output nodes insulated from each other.

6. A semiconductor memory device comprising:
   a memory array including a plurality of memory cells arranged in a plurality of rows and a plurality of columns, a plurality of word lines provided for the plurality of rows, respectively, and a plurality of pairs of bit lines provided for the plurality of columns, respectively;

a row decoder provided for each word line, responsive to application of a row address signal previously allotted a word line corresponding thereto, for setting the word line corresponding thereto to a selected level and activating a plurality of memory cells corresponding thereto;

a column decoder responsive to a column address signal for selecting any pair of said plurality of pairs of bit lines; and a read/write circuit reading/writing data from/to a memory cell activated by said row decoder, via a pair of bit lines selected by said column decoder;

said row decoder including a first transistor of a first conductivity type, having a first electrode receiving a first signal having two values corresponding to a high potential higher than a power supply potential and a negative potential, and a second electrode connected to a word line corresponding thereto, a second transistor of a second conductivity type, having a first electrode receiving said negative potential, a second electrode connected to a word line corresponding thereto, and an input electrode receiving a second signal having two values corresponding to said high potential and said negative potential, a third transistor of the first conductivity type, having a first electrode receiving said second signal, a second electrode connected to the input electrode of said first transistor, and an input electrode receiving a ground potential, and a signal generation circuit responsive to application of a row address signal previously allotted a word line corresponding thereto, for setting said first signal and said second signal to said high potential and said negative potential, respectively, and setting the word line corresponding thereto to a selected level.

7. The semiconductor memory device according to claim 6, wherein said row decoder also includes a fourth transistor of the second conductivity type having a first electrode receiving said second signal, a second electrode connected to the input electrode of said second transistor and an input electrode receiving said power supply potential, said second transistor receiving at its input electrode said second signal via said fourth transistor.

8. The semiconductor memory device according to claim 7, wherein said row decoder also includes a fifth transistor of the second conductivity type connected to said second transistor in parallel and having an input electrode receiving a third signal having two values corresponding to said power supply potential and said negative potential, said signal generation circuit being responsive to application of a row address signal previously allotted a word line corresponding thereto for setting said third signal to said negative potential.

9. The semiconductor memory device according to claim 6, provided on a semiconductor substrate, wherein said negative potential is also applied to said semiconductor substrate or a well thereof of the first conductivity type.

10. The semiconductor memory device according to claim 6, further comprising an external terminal for externally applying said negative potential to said row decoder.

11. The semiconductor memory device according to claim 6, wherein more than one said memory array are provided, each memory array being provided with a negative-potential generation circuit for applying said negative potential to said row decoder corresponding to a memory array corresponding thereto, more than one said negative-potential generation circuit having their respective output nodes insulated from each other.

12. A semiconductor memory device comprising:

a memory array including a plurality of memory cells arranged in a plurality of rows and a plurality of columns, a plurality of word lines provided for the plurality of rows, respectively, and a plurality of pairs of bit lines provided for the plurality of columns, respectively;

a row decoder provided for each word line, responsive to application of a row address signal previously allotted a word line corresponding thereto, for setting the word line corresponding thereto to a selected level and activating a plurality of memory cells corresponding thereto;

a column decoder responsive to a column address signal for selecting any pair of said plurality of pairs of bit lines; and a read/write circuit reading/writing data from/to a memory cell activated by said row decoder, via a pair of bit lines selected by said column decoder;

said row decoder including a first transistor of a first conductivity type, having a first electrode receiving a first signal having two values corresponding to a first high potential higher than a power supply potential and a first negative potential, a second electrode connected to a word line corresponding thereto, and an input electrode receiving a second signal having two values corresponding to a second high potential higher than said power supply potential and a second negative potential, a second transistor of a second conductivity type, having a first electrode receiving a third negative potential and a second electrode connected to a word line corresponding thereto, a third transistor of the second conductivity type, having a first electrode receiving said second signal, a second electrode connected to the input electrode of said second transistor, and an input electrode receiving said power supply potential, and a signal generation circuit responsive to application of a row address signal previously allotted a word line corresponding thereto, for setting said first signal and said second signal to said first high potential and said second negative potential, respectively, and setting the word line corresponding thereto to a selected level.

* * * * *